(12) United States Patent
Zhou et al.

(10) Patent No.: US 12,041,805 B2
(45) Date of Patent: Jul. 16, 2024

(54) DISPLAY PANEL, METHOD FOR MANUFACTURING SAME, MASK ASSEMBLY, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Rui Zhou, Beijing (CN); Longhui Xue, Beijing (CN); Wei Zhang, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 488 days.

(21) Appl. No.: 17/419,737

(22) PCT Filed: Sep. 29, 2020

(86) PCT No.: PCT/CN2020/118678
§ 371 (c)(1),
(2) Date: Jun. 30, 2021

(87) PCT Pub. No.: WO2022/067464
PCT Pub. Date: Apr. 7, 2022

(65) Prior Publication Data
US 2022/0320459 A1    Oct. 6, 2022

(51) Int. Cl.
*H10K 59/35*    (2023.01)
*H10K 50/813*  (2023.01)
(Continued)

(52) U.S. Cl.
CPC ......... *H10K 50/822* (2023.02); *H10K 50/813* (2023.02); *H10K 59/131* (2023.02);
(Continued)

(58) Field of Classification Search
CPC .... H10K 50/822; H10K 50/813; H10K 50/82; H10K 59/353; H10K 59/179; H10K 59/351; H10K 59/352
See application file for complete search history.

(56) References Cited

U.S. PATENT DOCUMENTS

| | | | |
|---|---|---|---|
| 10,762,828 B1* | 9/2020 | Ma | G09G 3/2092 |
| 2014/0242737 A1* | 8/2014 | Chung | H10K 71/00 |
| | | | 118/504 |

(Continued)

FOREIGN PATENT DOCUMENTS

| | | |
|---|---|---|
| CN | 1747614 A | 3/2006 |
| CN | 103346271 A | 10/2013 |

(Continued)

*Primary Examiner* — Eric K Ashbahian
*Assistant Examiner* — Halee Cramer
(74) *Attorney, Agent, or Firm* — Lippes Mathias LLP

(57) ABSTRACT

A display panel includes a base substrate including a first display region and a second display region disposed on a side of the first display region. The display panel also includes a first anode layer, a first light-emitting layer and a first cathode layer which are disposed in the first display region and are sequentially laminated in a direction distal from the base substrate. The display panel also includes a second anode layer, a second light-emitting layer and a second cathode layer which are disposed in the second display region and are sequentially laminated in a direction distal from the base substrate.

20 Claims, 24 Drawing Sheets

(51) Int. Cl.
*H10K 50/822* (2023.01)
*H10K 59/131* (2023.01)
*H10K 71/00* (2023.01)
*H10K 59/12* (2023.01)

(52) U.S. Cl.
CPC ........... *H10K 59/353* (2023.02); *H10K 71/00* (2023.02); *H10K 59/1201* (2023.02)

(56) References Cited

U.S. PATENT DOCUMENTS

| | | |
|---|---|---|
| 2015/0303399 A1 | 10/2015 | Cui et al. |
| 2015/0364715 A1* | 12/2015 | Yoon .................... H10K 59/351 257/40 |
| 2019/0148680 A1 | 5/2019 | Xin et al. |
| 2020/0357998 A1 | 11/2020 | Bai et al. |
| 2021/0371968 A1* | 12/2021 | Higuchi ............... H10K 71/621 |
| 2023/0083099 A1* | 3/2023 | Xu .................... H10K 59/8052 257/79 |

FOREIGN PATENT DOCUMENTS

| | | |
|---|---|---|
| CN | 108866476 A | 11/2018 |
| CN | 109136833 A | 1/2019 |
| CN | 109148535 A | 1/2019 |
| CN | 109722629 A | 5/2019 |
| CN | 109957754 A | 7/2019 |
| CN | 111441013 A | 7/2020 |
| JP | 2000082582 A | 3/2000 |

\* cited by examiner

DISPLAY PANEL, METHOD FOR MANUFACTURING SAME, MASK ASSEMBLY, AND DISPLAY DEVICE

CROSS-REFERENCE TO RELATED APPLICATION

This application is a 371 of PCT Application No. PCT/CN2020/118678, filed on Sep. 29, 2020, the disclosure of which is incorporated herein by reference in its entirety.

TECHNICAL FIELD

The present disclosure relates to the field of display technologies, and in particular, relates to a display panel, a method for manufacturing the same, a mask assembly, and a display device.

BACKGROUND

An organic light-emitting diode (OLED) display panel is widely applied due to its advantages of self-illumination, low driving voltage, fast response, and the like.

SUMMARY

In one aspect, a display panel is provided, and includes:
a base substrate, comprising a first display region and a second display region disposed on a side of the first display region;
a first anode layer, a first light-emitting layer and a first cathode layer which are disposed in the first display region and are sequentially laminated in a direction distal from the base substrate; and
a second anode layer, a second light-emitting layer and a second cathode layer which are disposed in the second display region and are sequentially laminated in a direction distal from the base substrate,
wherein the second cathode layer includes a plurality of cathode patterns which are independent from each other in a first direction or a second direction; and each of the cathode patterns includes a main body portion and a connection portion connected to the main body portion, the connection portion of each cathode pattern laps over the connection portion of an adjacent cathode pattern, and a distance between the connection portion and the base substrate is longer than or equal to a distance between the main body portion and the base substrate.

In another aspect, a mask assembly is provided. The mask assembly includes:
a first mask plate, including a first mask region and a second mask region, the second mask region including a plurality of first through holes; and
a second mask plate, including a third mask region and a fourth mask region, the fourth mask region including a plurality of second through holes,
wherein a minimum distance between a target first through hole of the plurality of first through holes and the first mask region in a target direction is different from a minimum distance between a target second through hole of the plurality of second through holes and the third mask region in the target direction, wherein the target first through hole is a first through hole closest to the first mask region in the target direction among the plurality of first through holes, and the target second through hole is a second through hole closest to the third mask region in the target direction among the plurality of second through holes.

In yet another aspect, a method for manufacturing a display panel is provided. The method includes:
providing a base substrate, including a first display region and a second display region disposed on a side of the first display region;
forming a first anode layer in the first display region, and forming a second anode layer in the second display region;
forming a first light-emitting layer in the first display region, and forming a second light-emitting layer in the second display region;
forming a first cathode layer in the first display region, and forming a plurality of first cathode patterns of a second cathode layer in the second display region; and
forming a plurality of second cathode patterns of the second cathode layer in the second display region,
wherein each cathode pattern of the plurality of first cathode patterns and the plurality of second cathode patterns includes a main body portion and a connection portion connected to the main body portion, the connection portion of each of the second cathode patterns laps over the connection portion(s) of one or more adjacent first cathode patterns, a distance between the connection portion of each of the second cathode patterns and the base substrate is longer than that between the main body portion and the base substrate, and a distance between the connection portion of each of the first cathode patterns and the base substrate is equal to that between the main body portion and the base substrate.

In still yet another aspect, a display device is provided. The display device includes an image sensor and the display panel as described above, wherein the image sensor is disposed on a side of a base substrate distal from a second anode layer in the display panel, and is disposed in a second display region of the base substrate.

BRIEF DESCRIPTION OF THE DRAWINGS

For clearer descriptions of the technical solutions in the embodiments of the present disclosure the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

In the related art, in order to increase the screen-to-body ratio of a display panel, a front camera of a display device may be arranged in a display region of the display panel. The display region of the display panel includes an anode layer, a light-emitting layer and a cathode layer which are sequentially laminated in a direction distal from a base substrate; and the front camera is arranged on the side of the anode layer distal from the light-emitting layer.

However, since the cathode layer adversely affects light transmittance, the imaging effect of the front camera arranged in the display region of the display panel is poor.

Figure 1:
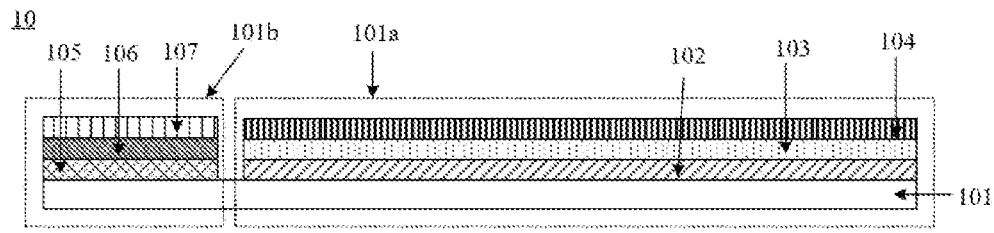
FIG. 1 is a schematic structural diagram of a display panel according to an embodiment of the present disclosure.

FIG. 1 is a schematic structural diagram of a display panel according to an embodiment of the present disclosure. Referring to FIG. 1, it can be seen that the display panel 10 may include a base substrate 101, a first anode layer 102, a first light-emitting layer 103, a first cathode layer 104, a second anode layer 105, a second light-emitting layer 106 and a second cathode layer 107.

The base substrate 101 may include a first display region 101a and a second display region 101b disposed on one side of the first display region 101a. The first anode layer 102, the first light-emitting layer 103 and the first cathode layer 104 may be disposed in the first display region 101a, and are sequentially laminated in a direction distal from the base substrate 101. The second anode layer 105, the second light-emitting layer 106 and the second cathode layer 107 may be disposed in the second display region 101b, and are sequentially laminated in the direction distal from the base substrate 101.

Figure 2:
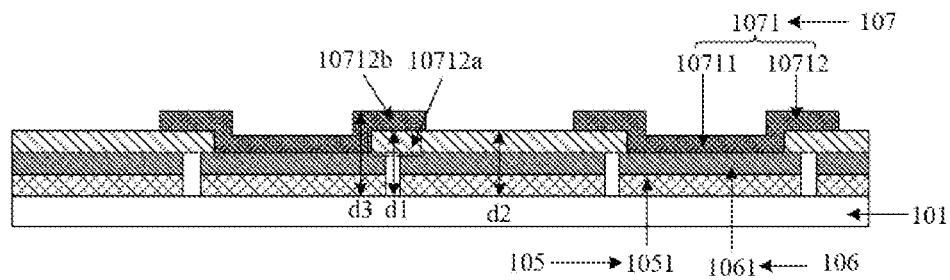
FIG. 2 is a sectional view of a second cathode layer according to an embodiment of the present disclosure.
Figure 3:
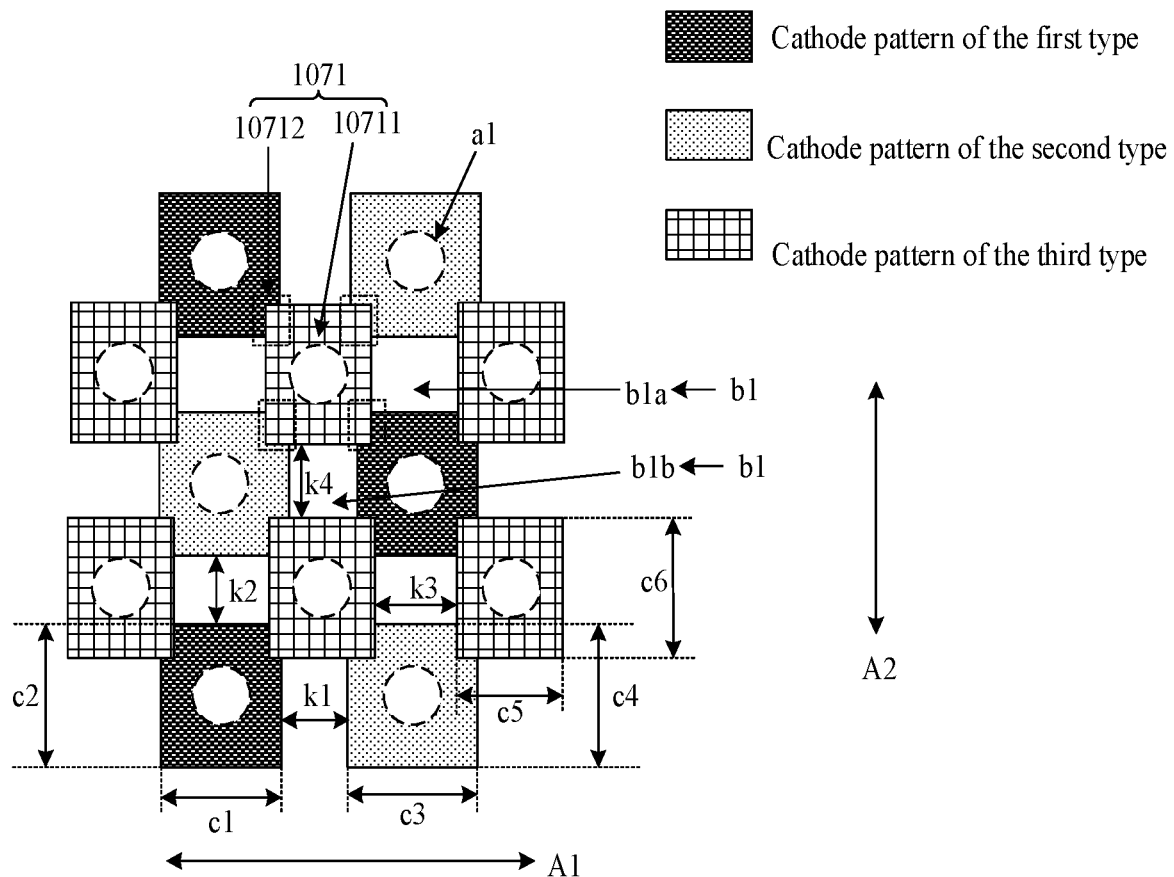
FIG. 3 is a schematic structural diagram of a second cathode layer according to an embodiment of the present disclosure.

FIG. 2 is a sectional view of a second cathode layer according to an embodiment of the present disclosure. FIG. 3 is a schematic structural diagram of a second cathode layer according to an embodiment of the present disclosure. With reference to FIGS. 2 and 3, it can be seen that the second cathode layer 107 may include a plurality of cathode patterns 1071. Referring to FIG. 3, the plurality of cathode patterns 1071 is independent from each other in a first direction or a second direction. That is, in the first direction or the second direction, there is a gap between every two adjacent cathode patterns 1071. The first direction may be a pixel row direction A1, and the second direction may be a pixel column direction A2.

In addition, each of the cathode patterns 1071 may include a main body portion 10711 and a connection portion 10712 connected to the main body portion 10711. The connection portion 10712 of each cathode pattern 1071 may lap over the connection portion 10712 of the adjacent cathode pattern 1071, and a distance between the connection portion 10712 and the base substrate 101 may be longer than or equal to that between the main body portion 10711 and the base substrate 101.

A connection line between each cathode pattern 1071 and the cathode pattern 1071 lapped thereto is not parallel to the first direction or the second direction. For example, an angle between the connection line between each cathode pattern 1071 and the cathode pattern 1071 lapped thereto and the first direction or the second direction may be 45 degrees.

For example, referring to FIG. 2, in every two lapped connection portions 10712, a first connection portion 10712*a* may be disposed in the same layer as the main body portion 10711 of the cathode pattern 1071, and a distance d1 between the first connection portion 10712*a* and the base substrate 101 may be equal to a distance d2 between the main body portion 10711 of the cathode pattern 1071 and the base substrate 101. In every two lapped connection portions 10712, a second connection portion 10712*b* is disposed in a layer on the main body portion 10711 of the cathode pattern 1071 distal from the base substrate 101, and a distance d3 between the second connection portion 10712*b* and the base substrate 101 may be longer than the distance d2 between the main body portion 10711 of the cathode pattern 1071 and the base substrate 101.

In the embodiments of the present disclosure, the distance between two structures may refer to the distance between the upper surfaces of the two structures, or the distance between the lower surfaces of the two structures. For example, the distance d1 between the first connection portion 10712*a* and the base substrate 101 may refer to the distance between the upper surface of the first connection portion 10712*a* and the upper surface of the base substrate 101, or may refer to the distance between the lower surface of the first connection portion 10712*a* and the lower surface of the base substrate 101.

Optionally, each cathode pattern 1071 may lap over the connection portions of four adjacent cathode patterns 1071, and the cathode pattern 1071 may include four connection portions 10712 (for example, four rectangular dashed boxes shown in FIG. 3, each of which represents one connection portion 10712). Of course, the cathode pattern 1071 disposed in an edge region of the display panel 10 may be adjacent to only one cathode pattern 1071 or two cathode patterns 1071, such that the cathode pattern 1071 disposed in the edge region of the display panel 10 may lap over fewer cathode patterns 1071. That is, the cathode pattern 1071 disposed in the edge region may include fewer connection portions 10712.

Referring to FIG. 3, since the plurality of cathode patterns 1071 is independent from each other in the first direction or the second direction, the plurality of cathode patterns 1071 included in the second cathode layer 107 does not completely cover the second display region 101*b*. Thus, light can pass through the gaps among the plurality of cathode patterns 1071, thereby reducing the influence of the second cathode layer 107 on light transmittance, and ensuring the imaging effect of the camera disposed in the second display region 101*b*. In addition, since the connection portion 10712 of each cathode pattern 1071 laps over the connection portion 10712 of the adjacent cathode pattern 1071, the plurality of cathode patterns 1071 included in the second cathode layer 107 can be communicated to each other. Therefore, it is ensured that signals of the second cathode layer 107 in the display panel 10 can be accurately transmitted, such that the second display region 101*b* can display images normally.

In summary, the embodiments of the present disclosure provide a display panel, and the second cathode layer included in the display panel may be disposed in the second display region of the base substrate. Since the plurality of cathode patterns included in the second cathode layer is independent from each other in the first direction or the second direction, the plurality of cathode patterns does not completely cover the second display region. Thus, the influence of the second cathode layer on the light transmission can be reduced, and the imaging effect of the camera disposed in the second display region is better.

Figure 4:
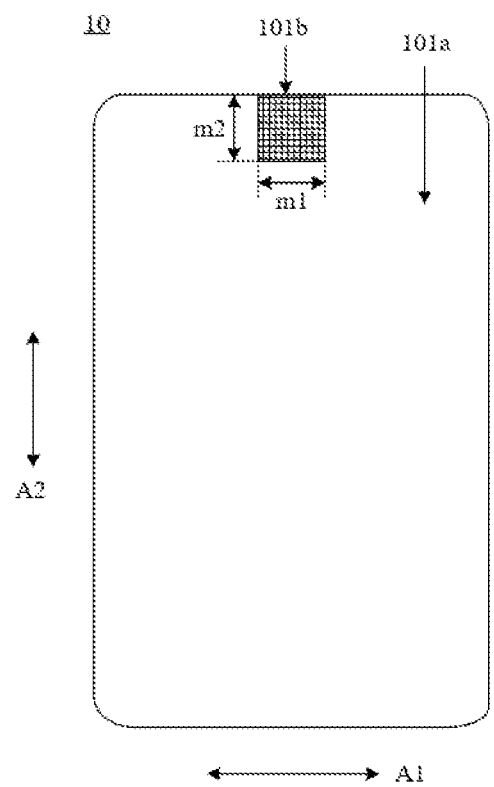
FIG. 4 is a top view of a display panel according to an embodiment of the present disclosure.

FIG. 4 is a top view of a display panel according to an embodiment of the present disclosure. Referring to FIG. 4, it can be seen that the shape of the second display region 101*b* may be a rectangle, and the length of one of the two perpendicular edges of the rectangle may be 2 mm (millimeter) to 10 mm, and the length of the other edge may be 2 mm to 15 mm.

In an example, the length m1 of the second display region 101*b* along the pixel row direction A1 may be 3.21 mm, that is, m1=3.21 mm. The length m2 of the second display region 101*b* along the pixel column direction A2 may be 3.04 mm, that is, m2=3.04 mm.

Optionally, the shape of each cathode pattern 1071 may be a regular figure or an irregular figure. Here, the regular figure may include a polygon, a circle, an ellipse, or the like, and the polygon may include a convex polygon and a concave polygon. The irregular figure may be a figure composed of curves and straight lines. That is, the shape of the cathode pattern 1071 is not limited in the embodiments of the present disclosure.

Of course, the shape of each connection portion 10712 may also be a regular figure or an irregular figure. Here, the shape of the connection portion 10712 may be determined by the shape of the cathode pattern 1071. For example, the connection portion 10712 may be polygonal, circular, elliptical or the like. That is, the shape of the connection portion 10712 is not limited in the embodiments of the present disclosure.

In the embodiments of the present disclosure, the first anode layer 102, the first light-emitting layer 103 and the first cathode layer 104 can be divided into a plurality of first sub-pixels. The second anode layer 105, the second light-emitting layer 106 and the second cathode layer 107 can be divided into a plurality of second sub-pixels. Here, the orthographic projection of each cathode pattern 1071 on the base substrate 101 may cover the orthographic projection of a light-emitting region a1 of at least one second sub-pixel on the base substrate 101.

Referring to FIG. 2, it can be seen that the second cathode layer 105 may include a plurality of anode patterns 1051. The second light-emitting layer 106 may include a plurality of light-emitting layer patterns 1061. In addition, the plurality of anode patterns 1051, the plurality of light-emitting layer patterns 1061 and the plurality of cathode patterns 1071 may be in one-to-one correspondence. Each anode pattern 1051, one corresponding light-emitting layer pattern 1061 corresponding and one corresponding cathode pattern 1071 may form one second sub-pixel.

Of course, the first anode layer 102 may also include a plurality of anode patterns (not shown in the figure). The second light-emitting layer 103 may include a plurality of light-emitting layer patterns (not shown in the figure). The plurality of anode patterns and the plurality of light-emitting layer patterns are in one-to-one correspondence. Each anode pattern, one corresponding light-emitting layer pattern and the first cathode layer may form one first sub-pixel.

Since the connection portion 10712 of each cathode pattern 1071 laps over the connection portion 10712 of the adjacent cathode pattern 1071, the connection portion 10712 has one more film layer (one more cathode pattern) than the main body portion 10711. There are more film layers at the connection portion 10712 and the film layers at the connection portion 10712 are thicker. The transmittance of each connection portion 10712 is lower than that of the main body portion 10711.

Optionally, the orthographic projection of the main body portion 10711 included in each cathode pattern 1071 on the base substrate 101 may cover the orthographic projection of the light-emitting region al of at least one second sub-pixel on the base substrate 101, while the orthographic projection of each connection portion 10712 included in each cathode pattern 1071 on the base substrate 101 may do not overlap the orthographic projection of the light-emitting region al of any second sub-pixel on the base substrate 101, such that the influence of the connection portion 10712 on the transmittance can be reduced, thereby ensuring the imaging effect of the camera.

In an example, referring to FIG. 3, the orthographic projection of the main body portion 10711 of each cathode pattern 1071 on the base substrate 101 may cover the orthographic projection of the light-emitting region al of one second sub-pixel on the base substrate 101. Alternatively, referring to FIG. 5, the orthographic projection of the main body portion 10711 of each cathode pattern 1071 on the base substrate 101 may cover the orthographic projections of the light-emitting regions al of two second sub-pixels on the base substrate 101.

Figure 6:
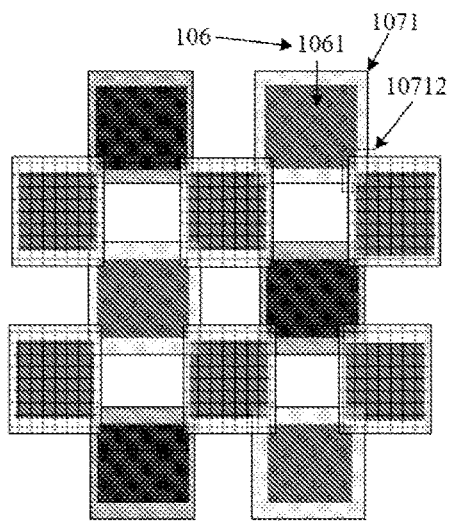
FIG. 6 is a schematic structural diagram of a second light-emitting layer and a second cathode layer according to an embodiment of the present disclosure.

FIG. 6 is a schematic structural diagram of a second light-emitting layer and a second cathode layer according to an embodiment of the present disclosure. With reference to FIG. 2 and FIG. 6, it can be seen that the plurality of light-emitting layer patterns 1061 included in the second light-emitting layer 106 may be spaced apart.

In order to ensure that the second sub-pixels disposed in the second display region 101b can emit light normally, the size of the light-emitting layer pattern 1061 of each second sub-pixel needs to be large. For example, referring to FIG. 7, in each second sub-pixel, the size of the light-emitting layer pattern 1061 may be larger than that of the anode pattern 1051, such that the orthographic projection of the light-emitting layer pattern 1061 on the base substrate 101 overlaps the orthographic projection of the connection portion 10712 on the base substrate 101. However, in order to avoid contact between the adjacent light-emitting layer patterns in the plurality of light-emitting layer patterns 1061, the overlapped region between the orthographic projection of the light-emitting layer pattern 1061 on the base substrate 101 and the orthographic projection of the connection portion 10712 on the base substrate 101 may be set to be small.

Of course, in order to avoid contact between the adjacent light-emitting layer patterns in the plurality of light-emitting layer patterns 1061, it may be set that the orthographic projection of the light-emitting layer pattern on the base substrate 101 does not overlap the orthographic projection of the connection portion 10712 on the base substrate 101.

Referring to FIG. 6, it can be seen that the shape of each light-emitting layer pattern 1061 may be a rectangle. Of course, each light-emitting layer pattern 1061 may also be in other shapes, which is not limited in the embodiments of the present disclosure. For example, the shape of the light-emitting layer pattern 1061 shown in FIG. 7 is a circle.

In the embodiments of the present disclosure, the light-emitting region of each sub-pixel may refer to an intersection region between a contact region between the anode pattern 1051 and the light-emitting layer pattern 1061 and a contact region between the light-emitting layer pattern 1061 and the cathode pattern 1071 in the sub-pixel.

Figure 7:
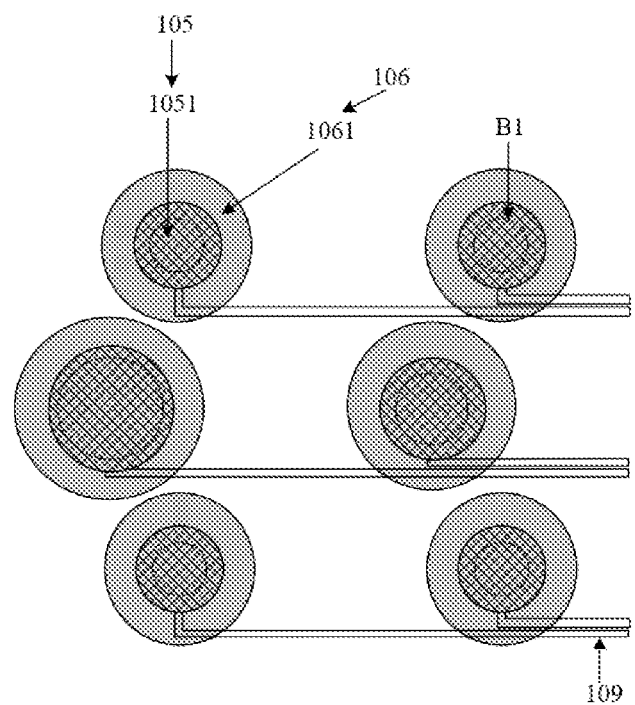
FIG. 7 is a schematic structural diagram of a second anode layer and a second light-emitting layer according to an embodiment of the present disclosure.

Exemplarily, in FIG. 7, B1 is a boundary line of an opening of a pixel define layer disposed on a side of the anode pattern 1051 distal from the base substrate 101. The region formed by the boundary line B1 in a surrounding fashion is the contact region between the anode pattern 1051 and the light-emitting layer pattern 1061. In addition, in order to avoid a smaller light-emitting region, after the cathode pattern 1071 is formed on a side, distal from the base substrate 101, of the light-emitting layer pattern 1061 of the sub-pixel, an orthographic projection of the contact region between the cathode pattern 1071 and the light-emitting layer pattern 1061 on the base substrate 101 may cover an orthographic projection of the region formed by the boundary line B1 in a surrounding fashion on the base substrate 101. Therefore, the intersection region between the contact region between the anode pattern 1051 and the light-emitting layer pattern 1061 and the contact region between the light-emitting layer pattern 1061 and the cathode pattern 1071 is the region formed by the boundary line B1 in a surrounding fashion. That is, in the embodiments of the present disclosure, the region formed by the boundary line B1 in a surrounding fashion may be taken as the light-emitting region of the sub-pixel. Therefore, the orthographic projection of the cathode pattern 1071 on the base substrate 101 covering the orthographic projection of the light-emitting region of the second sub-pixel on the base substrate 101 may refer to that the orthographic projection of the cathode pattern 1071 on the base substrate 101 covers an orthographic projection of the contact region (the region formed by the boundary line B1 in a surrounding fashion) between the anode pattern 1051 and the light-emitting layer pattern 1061 of the second sub-pixel on the base substrate 101.

Figure 8:
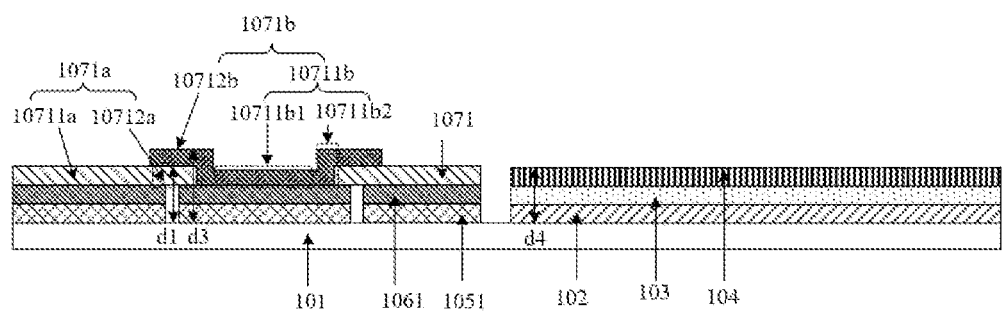
FIG. 8 is a schematic structural diagram of another display panel according to an embodiment of the present disclosure.

In the embodiments of the present disclosure, referring to FIG. 8, the main body portion 10711 of each cathode pattern 1071 in the second cathode layer 107 may be disposed on the same layer as the first cathode layer 104. That is, the distance between the main body portion 10711 and the base substrate 101 may be longer than or equal to the distance between the first cathode layer 104 and the base substrate 101.

Referring to FIG. 8, in every two lapped cathode patterns, the first main body portion 10711a and the first connection portion 10712a in the first cathode pattern 1071a may be disposed on the same layer. The first cathode pattern 1071a and the first cathode layer 104 may be prepared by the same one-time patterning process. The distance between the first main body portion 10711a of the first cathode pattern 1071a and the base substrate 101 may be equal to the distance between the first cathode layer 104 and the base substrate 101.

In addition, the second main body portion 10711b and the second connection portion 10712b in the second cathode pattern 1071b may be disposed on different layers. Referring to FIG. 8, the second main body portion 10711b of the second cathode pattern 1071b may include a first portion 10711b1 and a second portion 10711b2. The second portion 10711b2 is proximal to the connection portion 10712 relative to the first portion 10711b1, and the first portion 10711b1 and the connection portion 10712 are connected by the second portion 10711b2.

Here, the orthographic projection of the first portion 10711b1 on the base substrate 101 covers the orthographic projection(s) of the light-emitting region(s) of one or more second sub-pixels on the base substrate 101. The second portion 10711b2 may be in a slope-like structure connecting the first portion 10711b1 and the second connection portion 10712b. Thus, the distance between the first portion 10711b1 of the second main body portion 10711b and the base substrate 101 may be equal to that between the first cathode layer 104 and the base substrate 101. The distance between the second portion 10711b2 of the second main body portion 10711b and the base substrate 101 may be longer than or equal to that between the first cathode layer 104 and the base substrate 101.

Referring to FIG. 8, in every two lapped cathode patterns, the first connection portion 10712a of the first cathode pattern 1071a may be disposed on the same layer as the first cathode layer 104, and the second connection portion 10712b of the second cathode pattern 1071b is not disposed on the same layer as the first cathode layer 104. That is, the distance d1 between the first connection portion 10712a and the base substrate 101 may be equal to the distance d4 between the first cathode layer 104 and the base substrate 101. The distance d3 between the second connection portion 10712b and the base substrate 101 may be longer than the distance d4 between the first cathode layer 104 and the base substrate 101.

Figure 5:
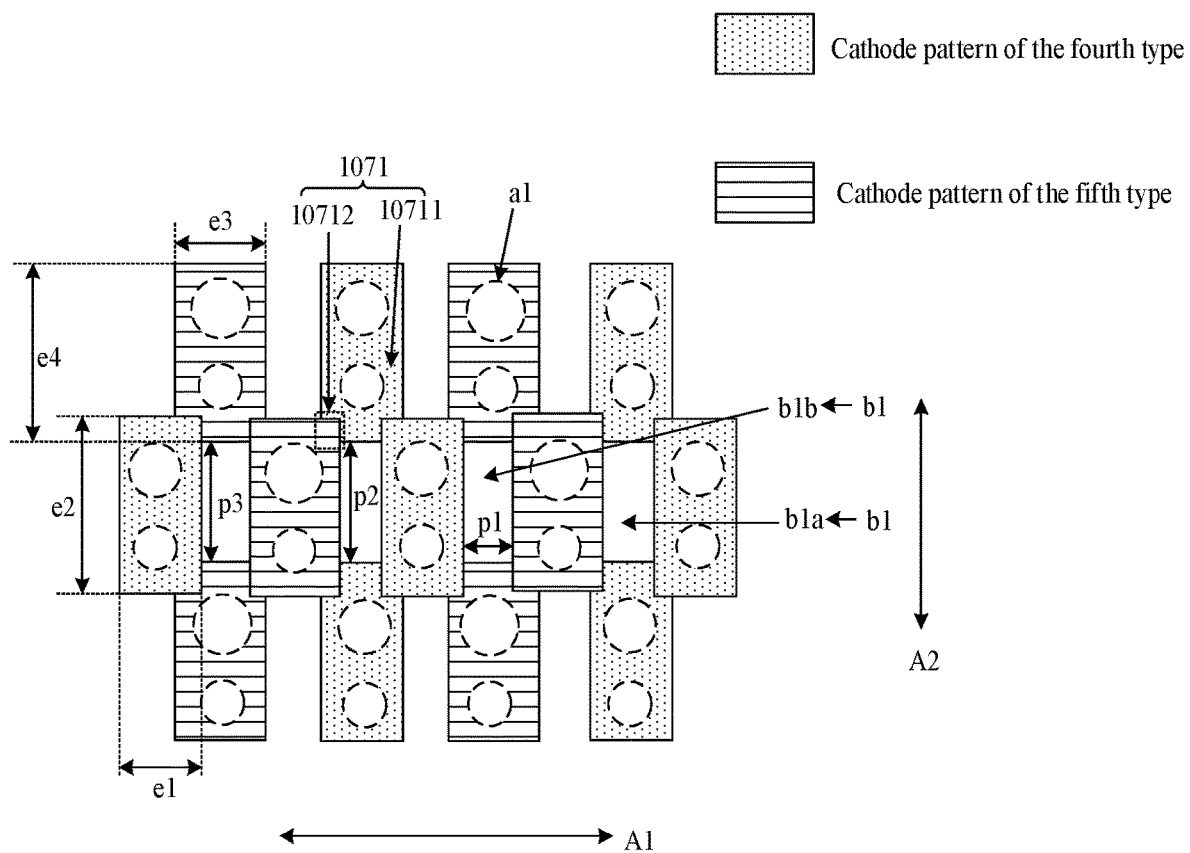
FIG. 5 is a schematic structural diagram of another second cathode layer according to an embodiment of the present disclosure.
Figure 9:
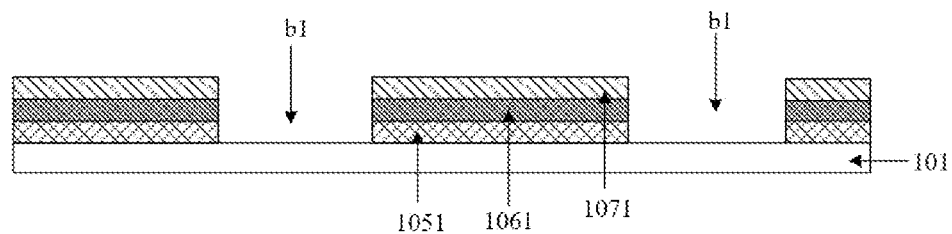
FIG. 9 is a schematic structural diagram of yet another display panel according to an embodiment of the present disclosure.

Referring to FIG. 3 and FIG. 5, it can be seen that the main body portions 10711 of the plurality of cathode patterns 1071 may form a plurality of hollowed-out portions b1 in a surrounding fashion. Referring to FIG. 9, relevant film layers (the anode pattern 1051, the light-emitting layer pattern 1061, and the cathode pattern 1071) of the second sub-pixel are not provided at the position of the hollowed-out portion b1, but provided at the position of the main body portion 10711. In addition, since the relevant film layers of the second sub-pixel adversely affect the transmittance to some extent, the transmittance of the hollowed-out portion b1 without the film layers of the second sub-pixel may be greater than that of the main body portion 10711 with the film layers of the second sub-pixel.

In addition, since the transmittance of each connection portion 10712 is lower than that of the main body portion 10711, the transmittance of each hollowed-out portion b1 is greater than that of the connection portion 10712.

In the embodiments of the present disclosure, since the relevant film layers of the second sub-pixel are not provided at the position of the hollowed-out portion b1 while more film layers are provided at the position of the connection portion 10712, the distance between the hollowed-out portion b1 and the base substrate 101 may be shorter than that between the connection portion 10712 and the base substrate 101.

Optionally, referring to FIG. 3 and FIG. 5, two adjacent hollowed-out portions b1 among the plurality of hollowed-out portions b1 may be spaced apart. In addition, the plurality of hollowed-out portions b1 may include a plurality of first hollowed-out portions b1a and a plurality of second hollowed-out portions b1b. Here, the area of the first hollowed-out portion b1a may be different from that of the second hollowed-out portion b1b. Optionally, the ratio of the area of the first hollowed-out portion b1a to the area of the second hollowed-out portion b1b may range from 0.8 to 1.2.

In an example embodiment, referring to FIG. 3, the first hollowed-out portion b1a may be formed in a surrounding fashion by the main body portion of one cathode pattern of the first type and the main body portion of one cathode pattern of the second type which are arranged along the pixel column direction A2, and the main body portions of two cathode patterns of the third type arranged along the pixel row direction A1. The second hollowed-out portion b1b may be formed in a surrounding fashion by the main body portion of one cathode pattern of the first type and the main body portion of one cathode pattern of the second type which are arranged along the pixel row direction A1, and the main body portions of two cathode patterns of the third type arranged along the pixel column direction A2. Here, different filled patterns are used in FIG. 3 to represent the cathode patterns of the first type, the cathode patterns of the second type and the cathode patterns of the third type.

Alternatively, referring to FIG. 5, the first hollowed-out portion b1a may be formed in a surrounding fashion by the main body portions of two cathode patterns of the fourth type arranged along the pixel column direction A2, and the main body portion of one cathode pattern of the fourth type and the main body portion of one cathode pattern of the fifth type which are arranged along the pixel row direction A1. The second hollowed-out portion b1b may be formed in a surrounding fashion by the main body portions of two cathode patterns of the fifth type arranged along the pixel column direction A2, and the main body portion of one cathode pattern of the fourth type and the main body portion of one cathode pattern of the fifth type which are arranged along the pixel row direction A1. Here, different filled patterns are used in FIG. 5 to represent the cathode patterns of the fourth types and the cathode patterns of the fifth types.

Of course, the display panel 10 may also include more types of hollowed-out portions, and the areas of the various types of hollowed-out portions may be different. The number of types of hollowed-out portions included in the display panel is not limited in the embodiments of the present disclosure.

Optionally, the shape of each hollowed-out portion b1 may be a regular figure or an irregular figure. Here, the shape of the hollowed-out portion b1 may be determined by the shape of the cathode pattern 1071. For example, the shape of the hollowed-out portion b1 may be a polygon, a circle, an ellipse, or the like. That is, the shape of the hollowed-out portion b1 is not limited in the embodiments of the present disclosure.

In an exemplary embodiment, referring to FIG. 3 and FIG. 5, the cathode pattern 1071 is rectangular, and each hollowed-out portion b1 may also be rectangular. Alternatively, if the cathode pattern 1071 is circular, the shape of each hollowed-out portion b1 may be a concave polygon formed by four cathode patterns 1071 in a surrounding fashion.

In addition, the shape of the hollowed-out portion b1 may be related to the shape of the camera arranged in the second display region 101b. Optionally, the boundary of one of the hollowed-out portions b1 is parallel to the boundary of the camera, such that the diffraction effect of the display panel 10 is reduced, and the display effect of the display panel 10 is ensured. For example, assuming that the camera is rectangular, then the plurality of hollowed-out portions b1 may also be rectangular. Assuming that the camera is circular, the plurality of hollowed-out portions b1 may also be circular.

Figure 10:
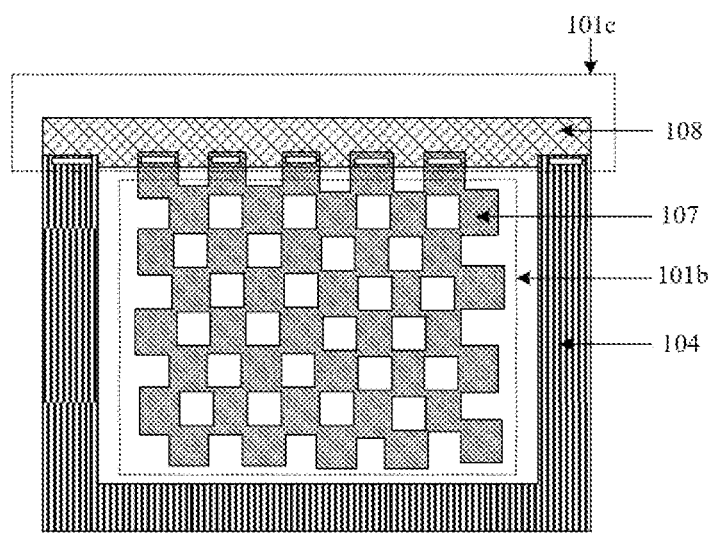
FIG. 10 is a schematic diagram of a partial structure of a display panel according to an embodiment of the present disclosure.

FIG. 10 is a schematic diagram of a partial structure of a display panel according to an embodiment of the present disclosure. Referring to FIG. 10, it can be seen that the base substrate 101 further includes a wiring region 101c disposed on the same side of the first display region 101a and the second display region 101b. The display panel 10 may further include a cathode signal line 108 disposed in the wiring region 101c.

Here, the cathode signal line 108 may be electrically connected to the first cathode layer 104 and the second cathode layer 107, and may be configured to provide cathode signals for the first cathode layer 104 and the second cathode layer 107. Optionally, the first cathode layer 104 and the second cathode layer 107 may be connected to the cathode signal line through via holes.

In the embodiments of the present disclosure, the cathode signal line 108 may be disposed on the same layer as the first anode layer 102 and the second anode layer 105, and a gap may exist between the cathode signal line 108 and the first anode layer 102, and between the cathode signal line 108 and the second anode layer 105. That is, the cathode signal line 108 may be prepared by the same one-time patterning process as the first anode layer 102 and the second anode layer 105. In addition, the signal transmitted by the cathode signal line 108 is different from signals of the first anode layer 102 and the second anode layer 105.

Optionally, materials for manufacturing the first anode layer 102 and the second anode layer 105 may include two indium tin oxide (ITO) layers and silver (Ag) disposed between the two ITO layers. The cathode signal line 108 may be prepared by the same one-time patterning process as any one of the two ITO layers, and the cathode signal line 108 may include an ITO layer. Alternatively, the cathode signal line 108 may also have the same structure as the first anode layer 102 and the second anode layer 105. That is, the cathode signal line 108 may include two ITO layers and one Ag layer. In an exemplary embodiment, the thickness of the cathode signal line 108 may range from 8 nm to 120 nm.

Figure 11:
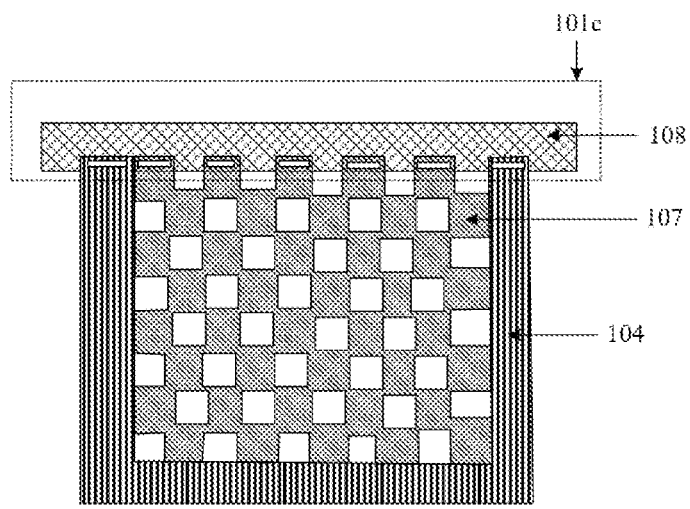
FIG. 11 is a schematic diagram of a partial structure of another display panel according to an embodiment of the present disclosure.

Referring to FIG. 10, the first cathode layer 104 and the second cathode layer 107 are not in contact with each other. The cathode signal line 108 may be electrically connected to the first cathode layer 104 and the second cathode layer 107, and provide cathode signals for the first cathode layer 104 and the second cathode layer 107. Alternatively, referring to FIG. 11, the first cathode layer 104 and the second cathode layer 107 may also be in contact with each other, such that in case that the connection between the cathode signal line 108 and the second cathode layer 107 is poor, the second cathode layer 107 may receive the cathode signal provided by the cathode signal line 108 through the first cathode layer 104, thereby ensuring the reliability of receiving the cathode signal by the second cathode layer 107.

Figure 12:
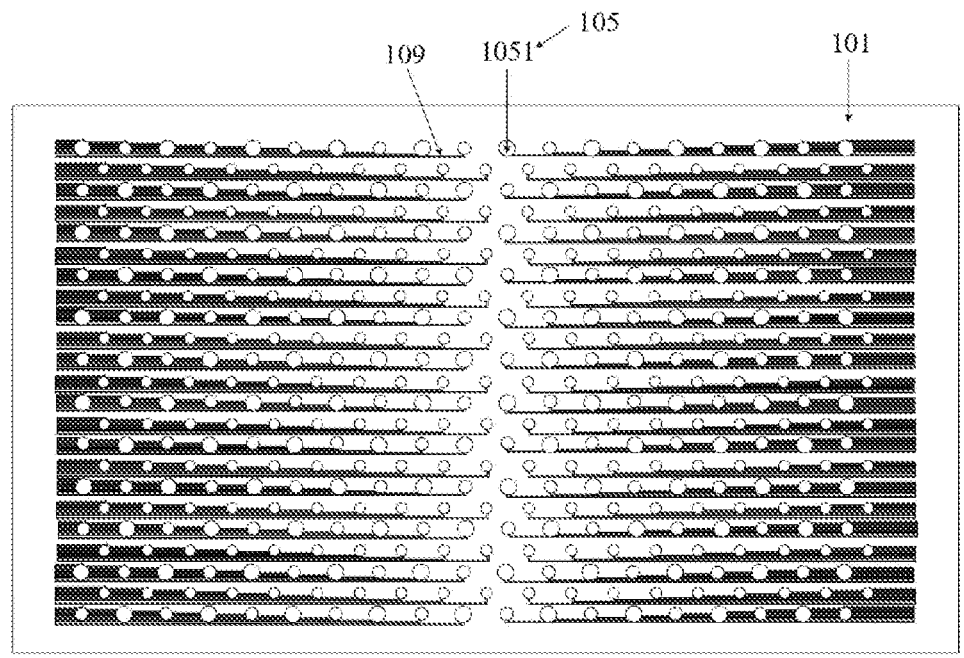
FIG. 12 is a schematic structural diagram of a second anode layer according to an embodiment of the present disclosure.
Figure 13:
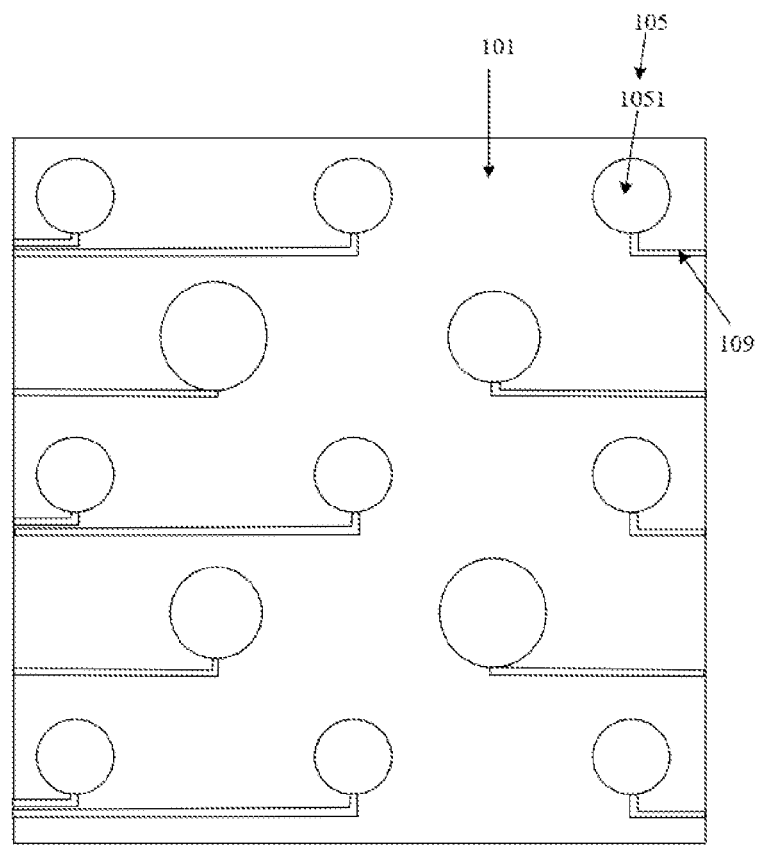
FIG. 13 is a schematic diagram of a partial structure of the second anode layer shown in FIG. 12.

FIG. 12 is a schematic structural diagram of a second anode layer according to an embodiment of the present disclosure. FIG. 13 is a schematic diagram of a partial structure of the second anode layer shown in FIG. 12. Referring to FIG. 2, FIG. 7, FIG. 12 and FIG. 13, the second anode layer 105 may include a plurality of anode patterns 1051. The display panel 10 may further include a plurality of anode signal lines 109.

In the embodiments of the present disclosure, the cathode patterns 107, the hollowed-out portions b1 and the connection portions 10712 are all rectangular. An extension direction of each anode signal line 109 may be parallel to that of one edge of the cathode pattern 1071. In addition, each anode pattern 1051 may be connected to one anode signal line 109, and the anode signal line 109 may provide an anode signal for the anode pattern 1051.

In addition, in order to avoid the anode signal line 109 disposed in the second display region 101b from affecting the light transmittance, the anode signal line 109 may be made from a transparent material. For example, the anode signal line 109 may be made from ITO.

Optionally, the orthographic projection of at least one of the anode signal lines 109 on the base substrate 101 may overlap the orthographic projection of the connection portion 10712 on the base substrate 101, and the orthographic projection of at least one of the anode signal lines 109 on the base substrate 101 may overlap the orthographic projection of the hollowed-out portion b1 on the base substrate 101. In addition, since the two adjacent anode signal lines are not collinear, distances between the two adjacent anode signal lines and the center of the hollowed-out portion b1 are different.

In the embodiments of the present disclosure, the second anode layer 105, the second light-emitting layer 106 and the second cathode layer 107 may be divided into at least one sub-pixel of a first color, at least one sub-pixel of a second color and at least one sub-pixel of a third color.

In an optional implementation, the orthographic projection of each of the cathode patterns 1071 on the base substrate 101 may cover the orthographic projection of the light-emitting region of at least one sub-pixel of the first color on the base substrate 101, or cover the orthographic projection of the light-emitting region of at least one sub-pixel of the second color on the base substrate 101, or cover the orthographic projection of the light-emitting region of at least one sub-pixel of the third color on the base substrate 101.

In the embodiments of the present disclosure, referring to FIG. 3, the plurality of cathode patterns may include a plurality of cathode patterns of a first type, a plurality of cathode patterns of a second type and a plurality of cathode patterns of a third type. Here, an orthographic projection of the cathode pattern of the first type on the base substrate 101 may cover the orthographic projection of the light-emitting region of the sub-pixel of the first color on the base substrate 101. An orthographic projection of the cathode pattern of the second type on the base substrate 101 may cover the orthographic projection of the light-emitting region of the sub-pixel of the second color on the base substrate 101. An orthographic projection of the cathode pattern of the third type on the base substrate 101 may cover the orthographic projection of the light-emitting region of the sub-pixel of the third color on the base substrate 101.

Optionally, the number of light-emitting regions of the sub-pixels covered by the cathode patterns of the first type, the number of light-emitting regions of the sub-pixels covered by the cathode patterns of the second type, and the number of light-emitting regions of the sub-pixels covered by the cathode patterns of the third type may be the same. In an exemplary embodiment, the orthographic projection of the cathode pattern of the first type on the base substrate 101 may cover the orthographic projection of the light-emitting region of one sub-pixel of the first color on the base substrate 101. The orthographic projection of the cathode pattern of the second type on the base substrate 101 may cover the orthographic projection of the light-emitting region of one sub-pixel of the second color on the base substrate 101. The orthographic projection of the cathode pattern of the third type on the base substrate 101 may cover the orthographic projection of the light-emitting region of one sub-pixel of the third color on the base substrate 101.

Of course, the number of light-emitting regions of the sub-pixels of the first color covered by the cathode patterns of the first type, the number of light-emitting regions of the sub-pixels of the second color covered by the cathode patterns of the second type, and the number of light-emitting regions of the sub-pixels of the third color covered by the cathode patterns of the third type may also be different, which is not limited in the embodiments of the present disclosure.

In addition, the number of the cathode patterns of the first type, the number of the cathode patterns of the second type and the number of the cathode patterns of the third type in the display panel 10 may be the same or different. For example, referring to FIG. 3, the number of the cathode patterns of the third type may be greater than that of the cathode patterns of the first type and greater than that of the cathode patterns of the second type. Here, the first color may be red, the second color may be blue, and the third color may be green.

In order to ensure the display effect of the display panel, generally, the area of the anode pattern of the sub-pixel of the second color (blue) may be larger than that of the anode pattern of the sub-pixel of the first color (red), and the area of the anode pattern of the sub-pixel of the first color (red) may be larger than that of the anode pattern of the sub-pixel of the third color (green), such that the area of the light-emitting region of the sub-pixel of the second color is larger than that of the light-emitting region of the sub-pixel of the first color, and the area of the light-emitting region of the sub-pixel of the first color is larger than that of the light-emitting region of the sub-pixel of the third color.

In order to ensure that the cathode pattern 1071 can completely cover the light-emitting region of the sub-pixel on the premise of improving the light transmittance, the area of the cathode pattern of the first type may be smaller than that of the cathode pattern of the second type, and the area of the cathode pattern of the third type may be smaller than that of the cathode pattern of the first type.

In another optional implementation, the orthographic projection of each of the cathode patterns 1071 on the base substrate 101 covers the orthographic projection of the light-emitting region of at least one sub-pixel of the first color on the base substrate 101 and the orthographic projection of the light-emitting region of at least one sub-pixel of the third color on the base substrate 101, or covers the orthographic projection of the light-emitting region of at least one sub-pixel of the second color on the base substrate 101 and the orthographic projection of the light-emitting region of at least one sub-pixel of the third color on the base substrate 101. Here, the first color may be red, the second color may be blue, and the third color may be green.

In the embodiments of the present disclosure, referring to FIG. 5, the plurality of cathode patterns may include a plurality of cathode patterns of a fourth type and a plurality of cathode patterns of a fifth type. Here, the orthographic projection of the cathode pattern of the fourth type on the base substrate 101 may cover the orthographic projection of the light-emitting region of the sub-pixel of the first color on the base substrate 101 and the orthographic projection of the light-emitting region of the sub-pixel of the third color on the base substrate 101. The orthographic projection of the cathode pattern of the fifth type on the base substrate 101 may cover the orthographic projection of the light-emitting region of the sub-pixel of the second color on the base substrate 101 and the orthographic projection of the light-emitting region of the sub-pixel of the third color on the base substrate 101.

Optionally, the number of light-emitting regions of the sub-pixels covered by the cathode pattern of the fourth type and the number of light-emitting regions of the sub-pixels covered by the cathode pattern of the fifth type may be the same. In an exemplary embodiment, the orthographic projection of the cathode pattern of the fourth type on the base substrate 101 may cover the orthographic projection of the light-emitting region of one sub-pixel of the first color on the base substrate 101 and the orthographic projection of the light-emitting region of one sub-pixel of the third color on the base substrate 101. The orthographic projection of the cathode pattern of the fifth type on the base substrate 101 may cover the orthographic projection of the light-emitting region of one sub-pixel of the second color on the base substrate 101 and the orthographic projection of the light-emitting region of one sub-pixel of the third color on the base substrate 101. That is, the orthographic projection of the cathode pattern of the fourth type on the base substrate 101 may cover the orthographic projections of the light-emitting regions of two sub-pixels on the base substrate 101. The orthographic projection of the cathode pattern of the fifth type on the base substrate 101 may cover the orthographic projections of the light-emitting regions of two sub-pixels on the base substrate 101.

Of course, the number of light-emitting regions of the sub-pixels covered by the cathode pattern of the fourth type and the number of light-emitting regions of the sub-pixels covered by the cathode pattern of the fifth type may also be different, which is not limited in the embodiments of the present disclosure.

In the embodiments of the present disclosure, the number of light-emitting regions of the sub-pixels of the first color covered by the cathode pattern of the fourth type may be the same as the number of light-emitting regions of the sub-pixels of the third color covered by the cathode pattern of the fourth type. The number of light-emitting regions of the sub-pixels of the second color covered by the cathode pattern of the fifth type may be the same as the number of light-emitting regions of the sub-pixels of the third color covered by the cathode pattern of the fifth type. Of course, the number of light-emitting regions of the sub-pixels of the first color covered by the cathode pattern of the fourth type may be different from the number of light-emitting regions of the sub-pixels of the third color covered by the cathode pattern of the fourth type, and the number of light-emitting regions of the sub-pixels of the second color covered by the cathode pattern of the fifth type may be different from the number of light-emitting regions of the sub-pixels of the third color covered by the cathode pattern of the fifth type, which are not limited in the embodiments of the present disclosure.

In addition, the number of the cathode patterns of the fourth type and the number of the cathode patterns of the fifth type in the display panel 10 may be different. For example, referring to FIG. 5, the number of the cathode patterns of the fourth type may be greater than that of the cathode patterns of the fifth type. Here, the first color may be red, the second color may be blue, and the third color may be green.

In order to ensure that the cathode pattern 1071 can completely cover the light-emitting region of the sub-pixel on the premise of improving the light transmittance, the area of the cathode pattern of the fourth type may be smaller than that of the cathode pattern of the fifth type.

In the above two implementations, the number of light-emitting regions of the sub-pixels covered by the cathode patterns in different regions of the second display region 101b may be different. For example, the number of light-emitting regions of the sub-pixels covered by each cathode pattern disposed in a central region of the second display region 101b may be small, and the number of light-emitting regions of the sub-pixels covered by each cathode pattern disposed in an edge region of the second display region 101b may be large. That is, the size of the cathode pattern disposed in the central region of the second display region 101b may be small, and the size of the cathode pattern disposed in the edge region of the second display region 101b may be large, such that when the camera is arranged in the second display region 101b, the cathode pattern in the central region of the second display region 101b can be prevented from severely affecting the camera, thereby ensuring the imaging effect of the camera.

In the embodiments of the present disclosure, referring to FIG. 3 and FIG. 5, the shape of each cathode pattern 1071 may be a polygon, which may be a rectangle. Here, the rectangle may be a rectangle with rounded corners.

Optionally, the length of each of two perpendicular edges of the cathode pattern 1071 ranges from 0.01 mm to 0.3 mm.

In an example, in the plurality of cathode patterns shown in FIG. 3, the length c1, along the pixel row direction A1, of the cathode pattern of the first type is 0.072 mm, and the length c2 along the pixel column direction A2 is 0.079 mm. That is, c1=0.072 mm, and c2=0.079 mm. The length c3, along the pixel row direction A1, of the cathode pattern of the second type is 0.079 mm, and the length c4 along the pixel column direction A2 is 0.079 mm. That is, c3=0.079 mm, and c4=0.079 mm. The length c5, along the pixel row direction A1, of the cathode pattern of the third type is 0.066 mm, and the length c6 along the pixel column direction A2 is 0.079 mm. That is, c5=0.066 mm, and c6=0.079 mm.

In the plurality of cathode patterns shown in FIG. 5, the length e1, along the pixel row direction A1, of the cathode pattern of the fourth type is 0.072 mm, and the length e2 along the pixel column direction A2 is 0.079 mm. That is, e1=0.072 mm, and e2=0.079 mm. The length e3, along the pixel row direction A1, of the cathode pattern of the fifth type is 0.079 mm, and the length e4 along the pixel column direction A2 is 0.139 mm. That is, e3=0.079 mm, and e4=0.139 mm.

Since each cathode pattern 1071 is rectangular, the connection portion 10712 of each cathode pattern 1071 may also be rectangular. In order to ensure the reliability of the connection between each cathode pattern 1071 and the adjacent cathode pattern 1071, the length of each of two perpendicular edges of the connection portion 10712 of each cathode pattern 1071 may range from 0.002 mm to 0.1 mm.

Figure 14:
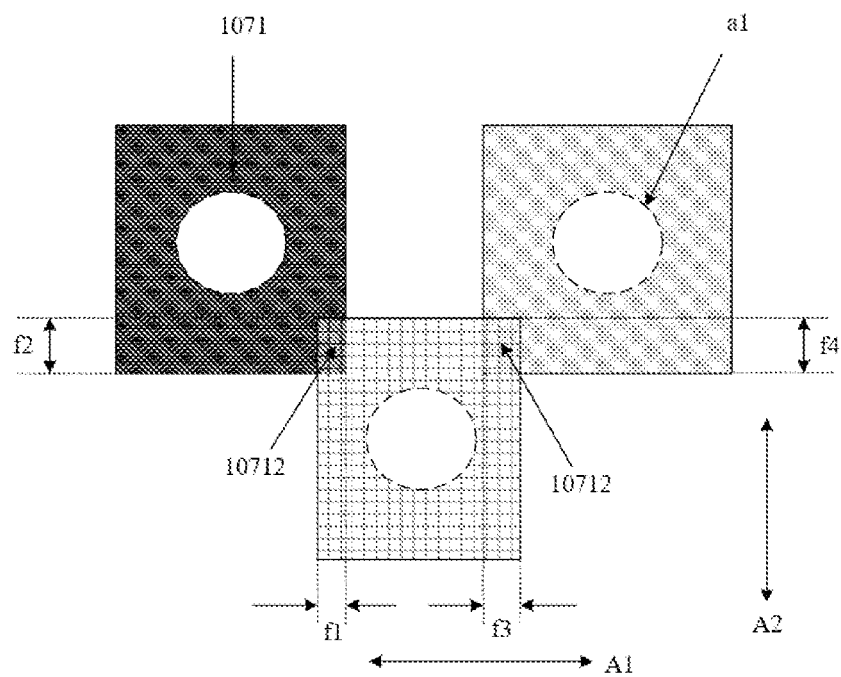
FIG. 14 is a schematic diagram of a partial structure of a plurality of cathode patterns shown in FIG. 3.

In an example, FIG. 14 is a schematic diagram of a partial structure of the plurality of cathode patterns shown in FIG. 3. Referring to FIG. 14, the length f1 of an overlapping portion of the connection portion 10712 of the cathode pattern of the third type and the connection portion 10712 of the cathode pattern of the first type along the pixel row direction A1 is 0.009 mm, and the length f2 of an overlapping portion along the pixel column direction A2 is 0.022 mm. That is, f1=0.009 mm, and f2=0.022 mm. The length f3 of an overlapping portion of the connection portion 10712 of the cathode pattern of the third type and the connection portion 10712 of the cathode pattern of the second type along the pixel row direction A1 is 0.012 mm, and the length f4 of the overlapping region along the pixel column direction A2 is 0.02 mm. That is, f3=0.012 mm, and f4=0.02 mm.

Figure 15:
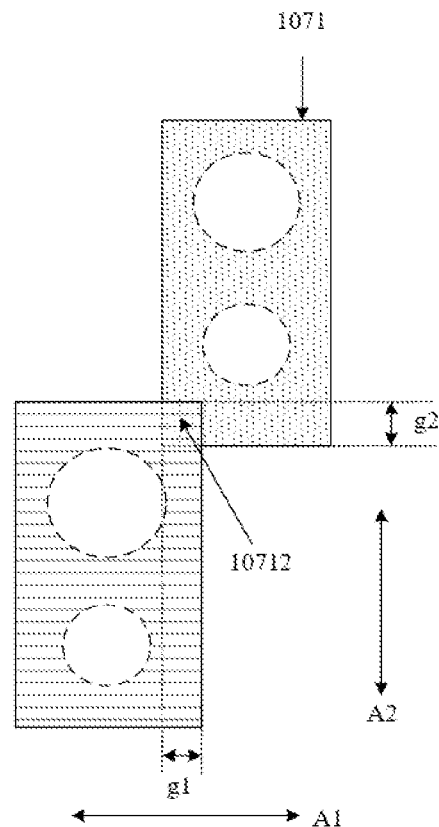
FIG. 15 is a schematic diagram of a partial structure of a plurality of cathode patterns shown in FIG. 5.

FIG. 15 is a schematic diagram of a partial structure of the plurality of cathode patterns shown in FIG. 5. Referring to FIG. 15, the length g1 of the connection portion 10712 of each cathode pattern 1071 along the pixel row direction A1 is 0.015 mm, and the length g2 along the pixel column direction A2 is 0.017 mm. That is, g1=0.015 mm, and g2=0.017 mm.

In the embodiments of the present disclosure, in order to ensure that the display panel has certain light transmittance, the distance between two adjacent cathode patterns may range from 0.01 mm to 0.2 mm.

In an example, in the plurality of cathode patterns shown in FIG. 3, the distance k1 between the cathode pattern of the first type and the cathode pattern of the second type adjacent thereto in the pixel row direction A1 is 0.045 mm, and the distance k2 between the cathode pattern of the first type and the cathode pattern of the second type adjacent thereto in the pixel column direction A2 is 0.041 mm. That is, k1=0.045 mm, and k2=0.041 mm. The distance k3 between two adjacent cathode patterns of the third type in the pixel row direction A1 is 0.055 mm, and the distance k4 between two adjacent cathode patterns of the third type in the pixel column direction A2 is 0.041 mm. That is, k3=0.055 mm, and k4=0.041 mm.

In the plurality of cathode patterns shown in FIG. 5, the distance p1 between the cathode pattern of the fourth type and the cathode pattern of the fifth type adjacent thereto in the pixel row direction A1 is 0.045 mm, the distance p2 of two adjacent cathode patterns of the fourth type in the pixel column direction A2 is 0.102 mm, and the distance p3 of two adjacent cathode patterns of the fifth type in the pixel column direction A2 is 0.101 mm. That is, p1=0.045 mm, p2=0.102 mm, and p3=0.101 mm.

Figure 16:
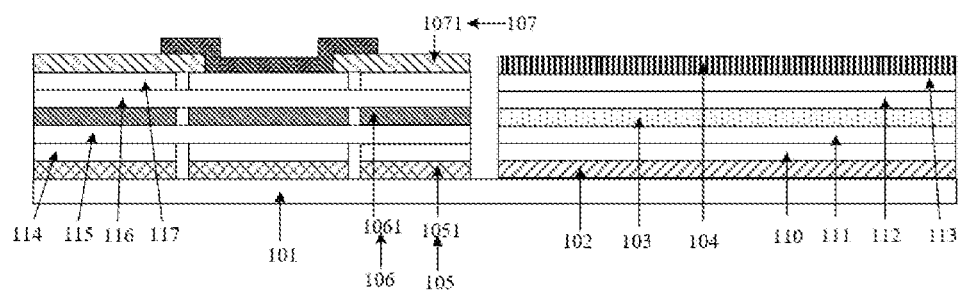
FIG. 16 is a schematic structural diagram of still another display panel according to an embodiment of the present disclosure.

FIG. 16 is a schematic structural diagram of still another display panel according to an embodiment of the present disclosure. Referring to FIG. 16, it can be seen that the display panel 10 may further include a first hole injection layer 110, a first hole transport layer 111, a first electron transport layer 112 and a first electron injection layer 113 which are disposed in the first display region 101a, as well as a second hole injection layer 114, a second hole transport layer 115, a second electron transport layer 116 and a second electron injection layer 117 which are disposed in the second display region 101b.

Here, the first anode layer 102, the first hole injection layer 110, the first hole transport layer 111, the first light-emitting layer 103, the first electron transport layer 112, the first electron injection layer 113 and the first cathode layer 104 are sequentially laminated in a direction distal from the base substrate 101. The second anode layer 105, the second hole injection layer 114, the second hole transport layer 115, the second light-emitting layer 106, the second electron transport layer 116, the second electron injection layer 117 and the second cathode layer 107 are sequentially laminated in the direction distal from the base substrate 101.

In summary, the embodiments of the present disclosure provide a display panel, and the second cathode layer included in the display panel may be disposed in the second display region of the base substrate. Since the plurality of cathode patterns included in the second cathode layer is independent from each other in the first direction or the second direction, the plurality of cathode patterns does not completely cover the second display region. Thus, the influence of the second cathode layer on the light transmission can be reduced, such that the imaging effect of the front camera disposed in the second display region is better.

Figure 17:
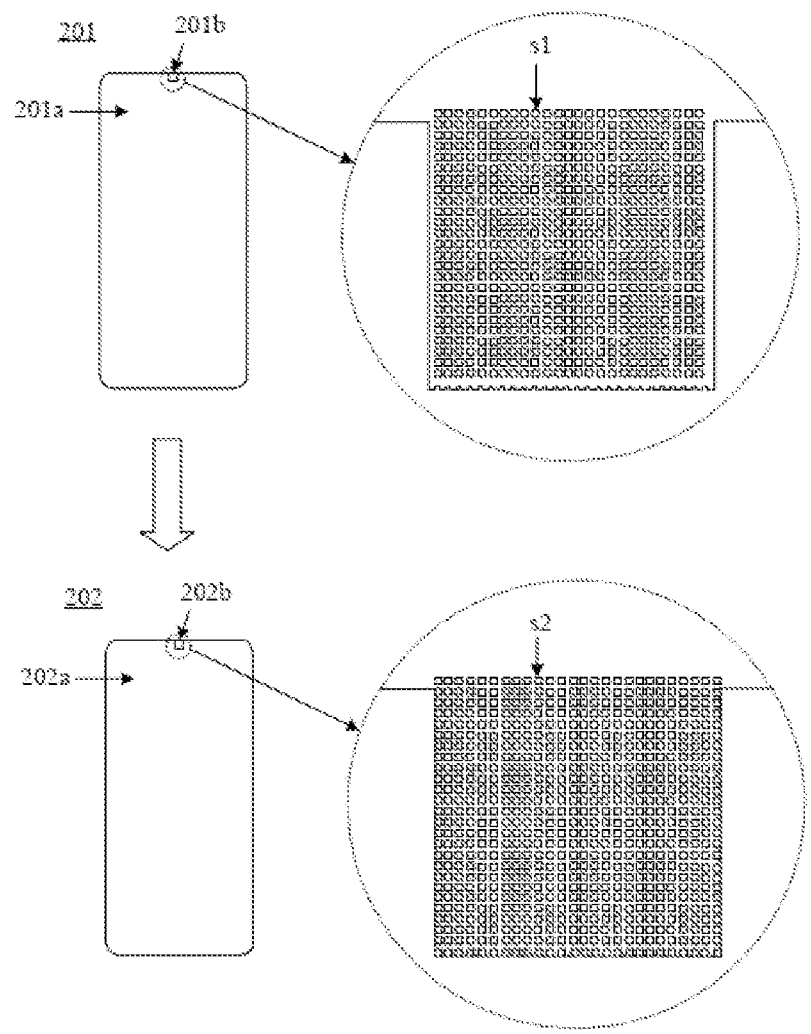
FIG. 17 is a schematic structural diagram of a mask assembly according to an embodiment of the present disclosure.

FIG. 17 is a schematic structural diagram of a mask assembly according to an embodiment of the present disclosure. Referring to FIG. 17, it can be seen that the mask assembly 20 may include a first mask plate 201 and a second mask plate 202. The first mask plate 201 may include a first mask region 201a, and a second mask region 201b, which may include a plurality of first through holes s1 therein. The second mask plate 202 may include a third mask region 202a, and a fourth mask region 202b, which may include a plurality of second through holes s2 therein.

Here, each of the first through holes s1 and the second through holes s2 may be configured to form one cathode pattern 1071 in the second cathode layer 107 in the display panel 10. The minimum distance between a target first through hole (s11, s12, s13) of the plurality of first through holes s1 and the first mask region 201a in a target direction may be different from the minimum distance between a target second through hole (s21, s22, s23) of the plurality of second through holes s2 and the third mask region 202a in the target direction. The target first through hole (s11, s12, s13) may be the first through hole closest to the first mask region 201a in the target direction among the plurality of first through holes s1, and the target second through hole (s21, s22, s23) is the second through hole closest to the third mask region 202a in the target direction among the plurality of second through holes s2. Optionally, the target direction may be the pixel row direction A1 or the pixel column direction A2.

Figure 18:
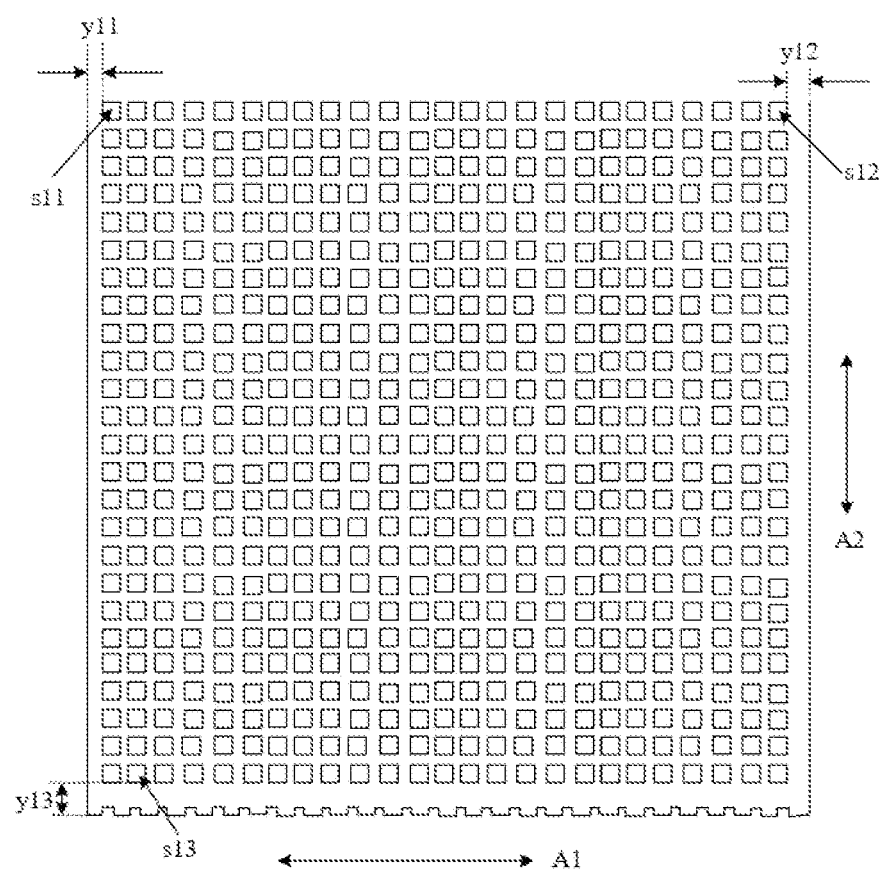
FIG. 18 is a schematic diagram of a second mask region of a first mask plate according to an embodiment of the present disclosure.
Figure 19:
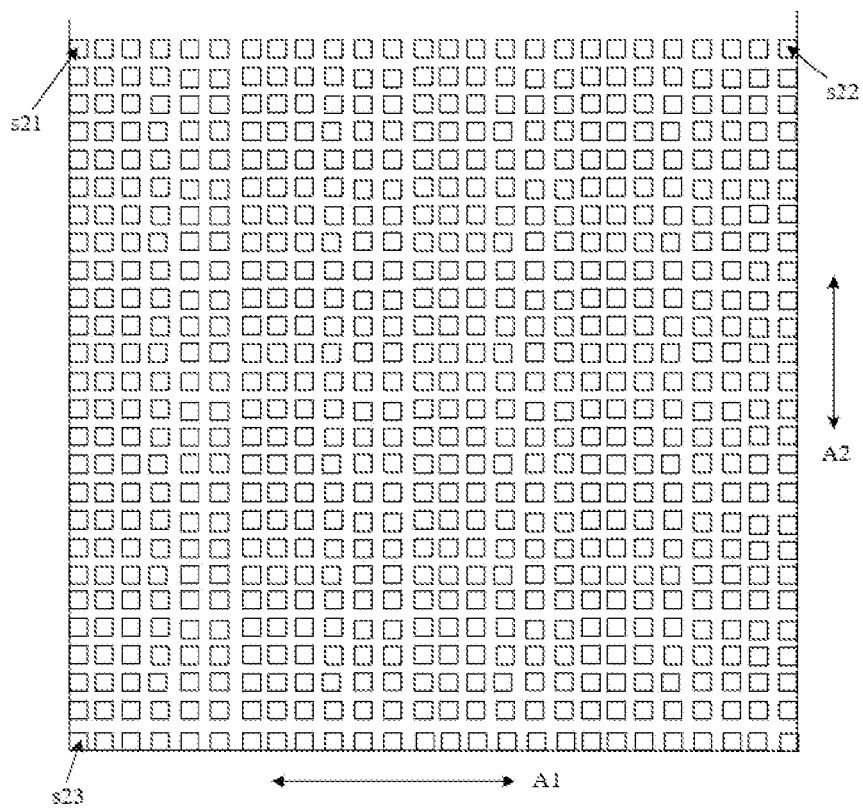
FIG. 19 is a schematic diagram of a fourth mask region of a second mask plate according to an embodiment of the present disclosure.

In an example, referring to FIG. 18 and FIG. 19, assuming that the target direction is the pixel row direction A1, then the target first through holes (s11, s12, s13) may be the leftmost column of first through holes s11 among the first through holes s1, or the rightmost column of first through holes s12 among the first through holes s1; and the target second through holes (s21, s22, s23) may be the leftmost column of second through holes s21 among the second through holes s2, or the rightmost column of second through holes s22 among the second through holes s2. Assuming that the target direction is the pixel column direction A2, then the target first through holes (s11, s12, s13) may be the lowermost row of the first through holes s13 among the first through holes s1, and the target second through holes (s21, s22, s23) may be the lowermost row of the second through holes s23 among the second through holes s2.

Referring to FIG. 18 and FIG. 19, the minimum distance y11 between the leftmost column of first through holes s11 and the second mask region 201b is different from that between the leftmost column of second through holes s21 and the fourth mask region 202b. The minimum distance y12 between the rightmost column of first through holes s12 and the second mask region 201b is different from that between the rightmost column of second through holes s22 and the fourth mask region 202b. The minimum distance y13 between the lowermost row of first through holes s13 and the second mask region 201b is different from that between the lowermost row of second through holes s23 and the fourth mask region 202b.

Optionally, when the mask assembly 20 according to the embodiment of the present disclosure is used to prepare the display panel 10, the first mask plate 201 may be used to prepare a film layer, and then the second mask plate 202 is used to prepare another film layer.

In summary, the present disclosure provides a mask assembly, which may include the first mask plate and the second mask plate. In addition, the minimum distance between the target first through hole disposed in the second mask region of the first mask plate and the first mask region in the target direction is different from the minimum distance between the target second through hole disposed in the fourth mask region of the second mask plate and the third mask region in the target direction, such that the second cathode layer of the display panel prepared by using the mask assembly is prevented from completely covering the second display region. Therefore, the influence of the second cathode layer on the light transmittance is reduced, and the imaging effect of the front camera disposed in the second display region is better.

In the embodiments of the present disclosure, the plurality of first through holes s1 in the first mask plate 201 and the plurality of second through holes s2 in the second mask plate 202 in the mask assembly 20 shown in FIG. 17 are approximately square, such that the cathode patterns 1071 of the second cathode layer 107 prepared by using the mask assembly 20 shown in FIG. 17 may be as shown in FIG. 3, and each cathode pattern 1071 covers the light-emitting region a1 of one second sub-pixel.

Optionally, the first mask plate 201 in the mask assembly 20 shown in FIG. 17 may be used to form the cathode pattern covering the light-emitting region of the sub-pixel of the first color shown in FIG. 3, and the cathode pattern covering the light-emitting region of the sub-pixel of the second color shown in FIG. 3. The second mask plate 202 in the mask assembly 20 shown in FIG. 17 may be used to form the cathode pattern covering the light-emitting region of the sub-pixel of the third color shown in FIG. 3.

Figure 20:
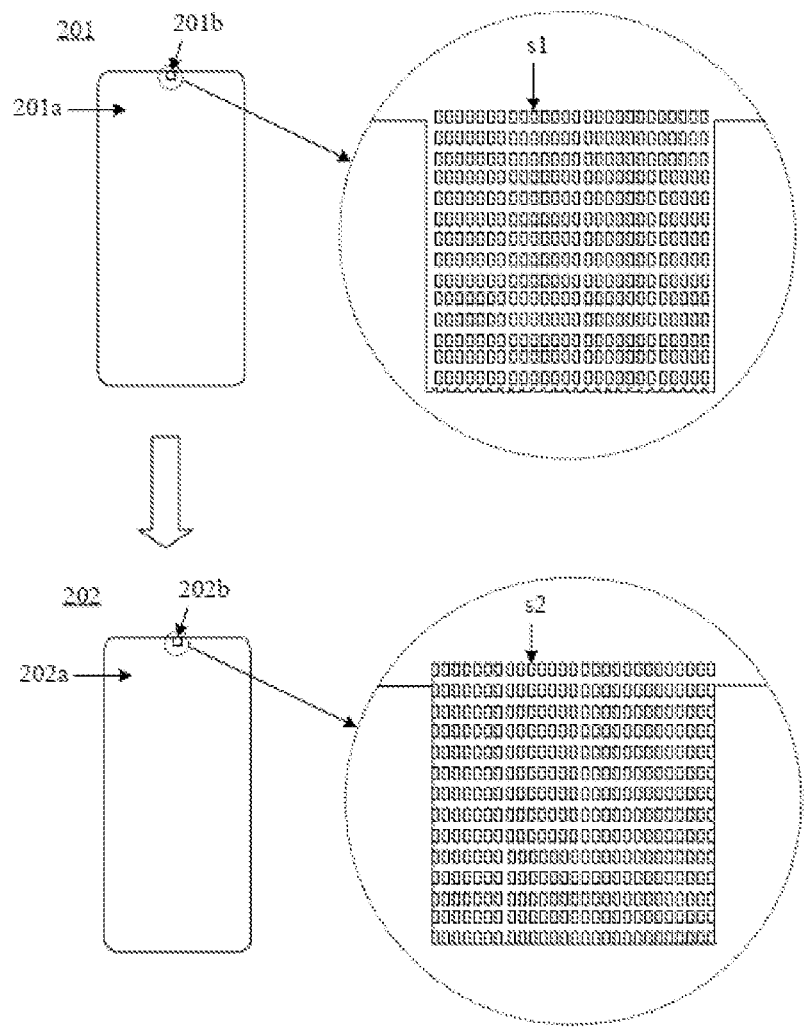
FIG. 20 is a schematic structural diagram of another mask assembly according to an embodiment of the present disclosure.

FIG. 20 is a schematic structural diagram of another mask assembly according to an embodiment of the present disclosure. Referring to FIG. 20, it can be seen that the plurality of first through holes s1 in the first mask plate 201 and the plurality of second through holes s2 in the second mask plate 202 are approximately rectangular, such that the cathode patterns 1071 of the second cathode layer 107 prepared by using the mask assembly 20 shown in FIG. 20 may be as shown in FIG. 5, and each cathode pattern 1071 covers the light-emitting regions a1 of two second sub-pixels.

Optionally, the first mask plate 201 in the mask assembly 20 shown in FIG. 20 may be used to form the cathode pattern covering the light-emitting region of the sub-pixel of the first color and the light-emitting region of the sub-pixel of the third color shown in FIG. 5. The second mask plate 202 in the mask assembly 20 shown in FIG. 20 may be used to form the cathode pattern covering the light-emitting region of the sub-pixel of the second color and the light-emitting region of the sub-pixel of the third color shown in FIG. 5.

In the embodiments of the present disclosure, when the mask assembly 20 according to the embodiment of the present disclosure is used to prepare the display panel 10, in order to form the first cathode layer 104 in the first display region 101a of the display panel 10 and to prevent the formed first cathode layer 104 from being too thick, one of the first mask region 201a and the third mask region 202a may be a hollow region, and the other mask region may be a solid material region.

In an example, the first mask region 201a may be a hollow region, and the third mask region 202a may be a solid material region. Thus, when the first mask plate 201 is used to prepare the film layer of the display panel 10, since the first mask region 201a is a hollow region, the first cathode layer 104 may be formed in the first display region 101a. In addition, when the second mask plate 202 is used to prepare the film layer of the display panel 10, since the third mask region 202a is a solid material region, no film layer is formed in the first display region 101a of the display panel 10.

In the embodiments of the present disclosure, the shorter the minimum distance between the target first through hole and the first mask region 201b (the hollow region) in the target direction is (that is, the smaller the area of the solid material is), the poorer the rigidity of the first mask plate 201 is. In addition, the poorer the rigidity of the first mask plate 201 is, the worse the precision of the formed cathode pattern is. Thus, in order to guarantee the precision of the formed cathode pattern, the minimum distance between the target first through hole of the plurality of first through holes s1 and the first mask region 201a in the target direction needs to be greater than a distance threshold.

In addition, since the third mask region 202a is a solid material region, even if the minimum distance between the target second through hole and the third mask region 202a in the target direction is short, the precision of the formed cathode pattern is not affected significantly.

That is, the minimum distance between the target first through hole and the first mask region 201b (the hollow region) in the target direction may be longer than that between the target second through hole and the third mask region 202b (the solid material region) in the target direction.

Figure 21:
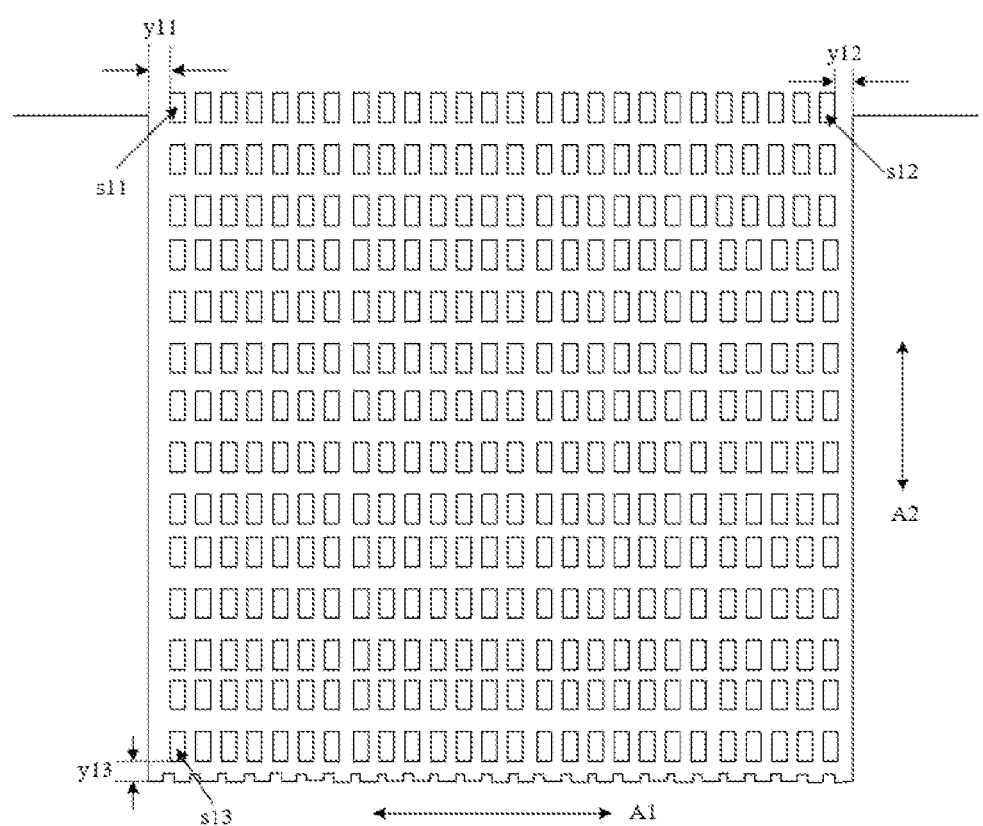
FIG. 21 is a schematic diagram of a second mask region of another first mask plate according to an embodiment of the present disclosure.
Figure 22:
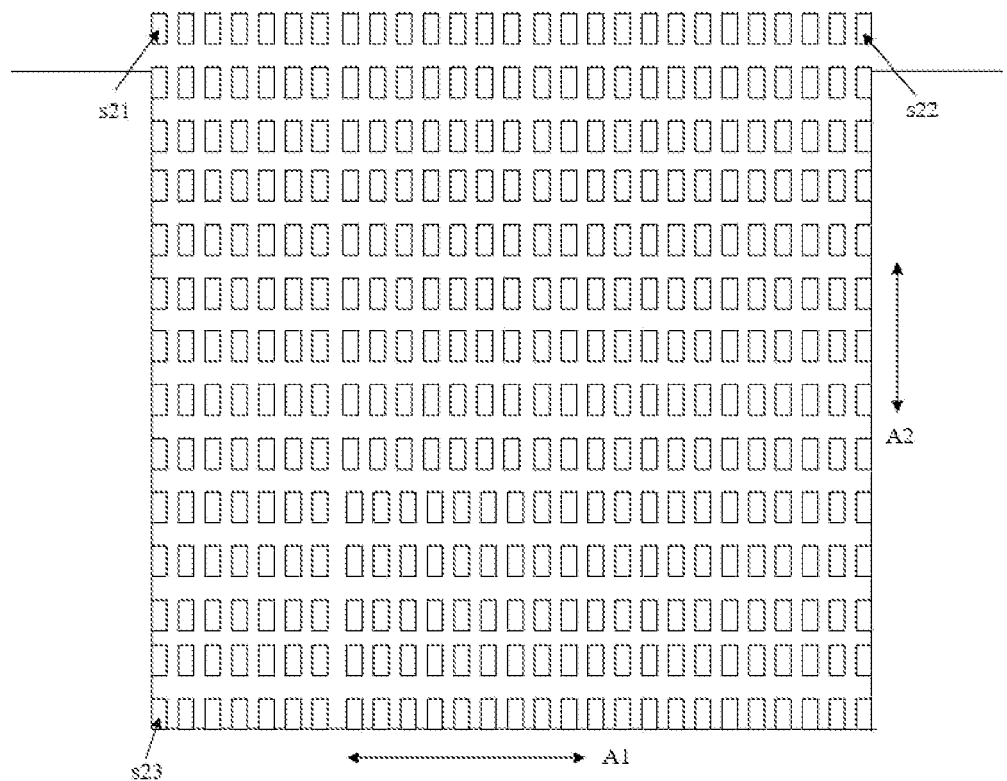
FIG. 22 is a schematic diagram of a fourth mask region of another second mask plate according to an embodiment of the present disclosure.

Optionally, the distance threshold may be 0.01 mm, and the distance between the target first through hole and the first mask region 201a in the target direction may be longer than 0.01 mm. That is, y11>0.01 mm, y12>0.01 mm, and y13>0.01 mm. In an example, in FIG. 18 and FIG. 21, y11, y12, and y13 may all be 0.059 mm. That is, y11=y12=y13=0.059 mm. In addition, referring to FIG. 19 and FIG. 22, the distance between the target second through hole and the third mask region in the target direction may be 0 mm.

Referring to FIG. 17, FIG. 18, FIG. 20 and FIG. 21, it can be seen that the lower boundary of the second mask region 201b of the first mask plate 201 may be of a sawtooth structure, to avoid the light-emitting region of the first sub-pixel of the first display region 101a in the display panel 10, such that the first cathode layer 104 can cover the light-emitting region of the first sub-pixel of the first display region 101a, thereby ensuring that the first sub-pixel can emit light normally. Of course, each of the left boundary and the right boundary of the second mask region 201b may be of a sawtooth structure, which is not limited in the embodiments of the present disclosure.

Alternatively, the lower boundary, the left boundary and the right boundary of the second mask region 201b may all be straight lines.

In the embodiments of the present disclosure, the minimum distance between each of the first through holes s1 and the first mask region 201a in the target direction may be different from the minimum distance between any one of the second through holes s2 and the third mask region 202a in the target direction, such that it is ensured that the first cathode pattern formed by means of the first through hole s1 can communicate with the second cathode pattern e formed by means of the second through hole s2, thereby ensuring normal display of the second display region 101b.

Figure 23:
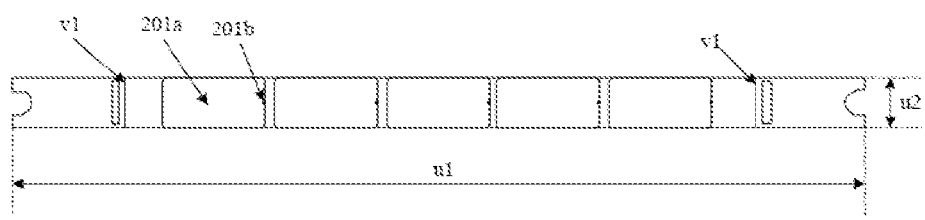
FIG. 23 is a schematic structural diagram of a first mask plate according to an embodiment of the present disclosure.

FIG. 23 is a schematic structural diagram of a first mask plate according to an embodiment of the present disclosure. Referring to FIG. 23, it can be seen that the first mask plate 201 may include a plurality of first mask regions 201a and a plurality of second mask regions 201b corresponding to the plurality of first mask regions 201a one by one. Each first mask region 201a and the corresponding second mask region 201b may be configured to form one film layer of the display panel 10. Here, FIG. 23 shows five first mask regions 201a and five second mask regions 201b.

Figure 24:
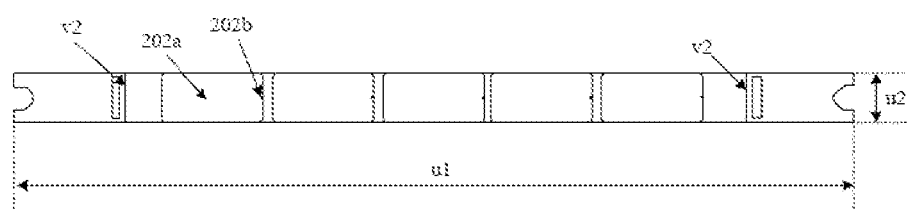
FIG. 24 is a schematic structural diagram of a second mask plate according to an embodiment of the present disclosure.

FIG. 24 is a schematic structural diagram of a second mask plate according to an embodiment of the present disclosure. Referring to FIG. 24, it can be seen that the second mask plate 202 may include a plurality of third mask regions 202a and a plurality of fourth mask regions 202b corresponding to the plurality of third mask regions 202a one by one. Each third mask region 202a and the corresponding fourth mask region 202b may be configured to form one film layer of the display panel 10. Here, FIG. 24 shows five third mask regions 202a and five fourth mask regions 202b.

Optionally, the size of the first mask plate 201 may be the same as that of the second mask plate 202. For example, the length u1 of each of the first mask plate 201 and the second mask plate 202 may be 1200 mm, and the width u2 thereof may depend on the width of the display panel 10. In an example, the width of the display panel 10 may range from 40 mm to 450 mm. Correspondingly, the width u2 of each of the first mask plate 201 and the second mask plate 202 may range from 40 mm to 450 mm. In addition, the length of the display panel 10 may range from 40 mm to 180 mm.

Figure 25:
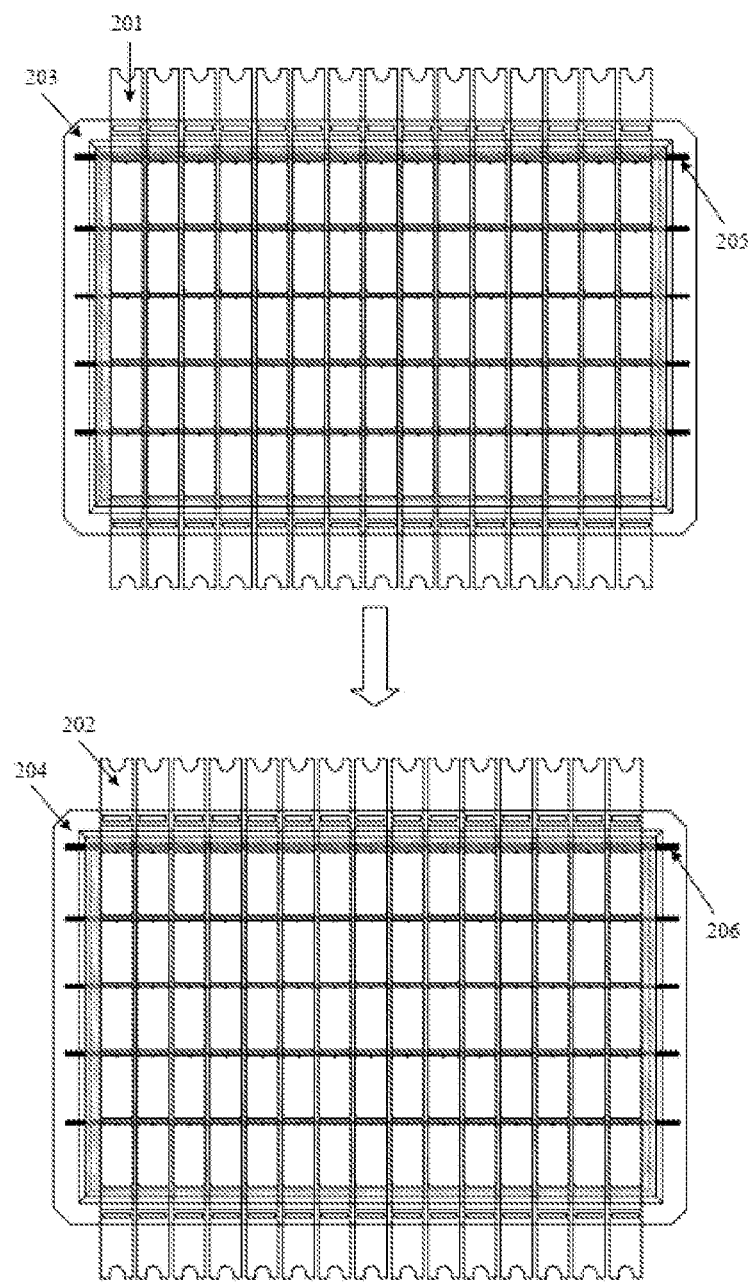
FIG. 25 is a schematic structural diagram of another mask assembly according to an embodiment of the present disclosure.

FIG. 25 is a schematic structural diagram of another mask assembly according to an embodiment of the present disclosure. Referring to FIG. 25, it can be seen that the mask assembly 20 may further include a first fixing assembly 203 and a second fixing assembly 204. The first fixing assembly 203 may be disposed on one side of the first mask plate 201 and fixedly connected to the first mask plate 201. The first fixing assembly 203 may be configured to fix the first mask plate 201. The second fixing assembly 204 may be disposed on one side of the second mask plate 202 and fixedly connected to the second mask plate 202. The second fixing assembly 204 may be configured to fix the second mask plate 202.

In an example, the first mask plate 201 may be welded to the first fixing assembly 203, and the second mask plate 202 may be welded to the second fixing assembly 204.

Figure 26:
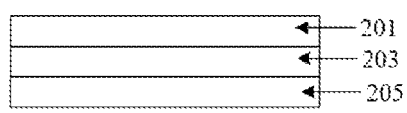
FIG. 26 is a diagram of a laminated relationship among a first fixing assembly, a first mask plate and a first support member according to an embodiment of the present disclosure.

Since the first mask region 201a of the first mask plate 201 is a hollow region, the second mask region 201b of the first mask plate 201 is in a suspended state. That is, the rigidity of the second mask region 201b of the first mask plate 201 is poorer. Referring to FIG. 25, the mask assembly 20 may further include a first support member 205 in the shape of a rod. FIG. 25 is a diagram illustrating a laminated relationship of a first fixing assembly, a first mask plate and a first support member according to an embodiment of the present disclosure. Referring to FIG. 26, the first support member 205 may be disposed on the side of the first fixing assembly 203 distal from the first mask plate 201, and the first support member 205 may be fixedly connected to the first fixing assembly 203. An extension direction of the first support member 205 may be parallel to the pixel row direction A1, and the first support member 205 may provide support for the second mask region 201b of the first mask plate 201.

Of course, in order to provide support for the fourth mask region 202b of the second mask plate 202, referring to FIG. 25, the mask assembly 20 may further include a second support member 206 in the shape of a rod. The second support member 206 may be disposed on the side of the second fixing assembly 204 distal from the second mask plate 202, and the second support member 206 may be fixedly connected to the second fixing assembly 204. An extension direction of the second support member 206 may be parallel to the pixel row direction A1.

In an example, the first support member 205 may be welded to the first fixing assembly 203, and the second support member 206 may be welded to the second fixing assembly 204.

In order to prevent the first support member 205 from affecting the film layers of the display panel 10, the orthographic projection of the first support member 205 on the first fixing assembly 203 does not overlap the orthographic projections of the first mask region 201a and the second mask region 201b in the first mask plate 201 on the first fixing assembly 203. In addition, in in order to prevent the second support member 206 from affecting the film layers of the display panel 10, the orthographic projection of the second support member 206 on the second fixing assembly 204 does not overlap the orthographic projections of the third mask region 202a and the fourth mask region 202b in the second mask plate 202 on the second fixing assembly 204.

In the embodiments of the present disclosure, the first mask plate 201 may be webbed to one side of the first fixing assembly 203 in a webbing manner, and then the first mask plate 201 is welded to the first fixing assembly 203. After that, the first support member 205 is disposed on the side of the first fixing assembly 203 distal from the first mask plate 201, and the first support member 205 is welded to the first fixing assembly 203. Finally, in order to prevent the boundary of the first mask plate 201 from exceeding the boundary of the first fixing assembly 203, the first mask plate 201 may be cut along a cutting line v1 of the first mask plate 201.

In addition, the second mask plate 202 may be webbed to one side of the second fixing assembly 204 in a webbing manner, and then the second mask plate 202 is welded to the second fixing assembly 204. After that, the second support member 206 is disposed on the side of the second fixing assembly 204 distal from the second mask plate 202, and the second support member 206 is welded to the second fixing assembly 204. Finally, in order to prevent the boundary of the second mask plate 202 from exceeding the boundary of the second fixing assembly 204, the second mask plate 202 may be cut along a cutting line v2 of the second mask plate 202.

Figure 27:
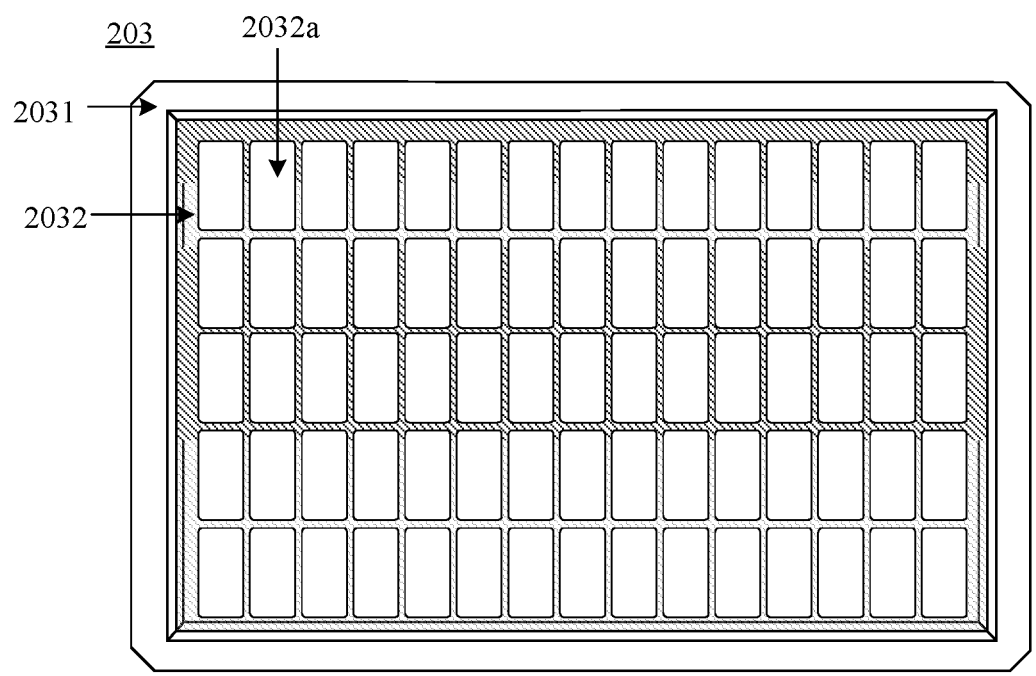
FIG. 27 is a schematic structural diagram of a first fixing assembly according to an embodiment of the present disclosure.

FIG. 27 is a schematic structural diagram of a first fixing assembly according to an embodiment of the present disclosure. Referring to FIG. 27, it can be seen that the first fixing assembly 203 may include a first fixing frame 2031 in the shape of a ring and a first fixing rack 2032 fixedly connected to the first fixing frame 2031. The first mask plate 201 may be fixedly connected to the first fixing frame 2031. Referring to FIG. 27, the first fixing rack 2032 may have a plurality of third through holes 2032a, and the first mask region 201a and the corresponding second mask region 201b may be disposed in one third through hole 2032a. Each third through hole 2032a may be configured to form one film layer of the display panel 10.

In the embodiments of the present disclosure, the structure of the second fixing assembly 204 may be the same as that of the first fixing assembly 203, and is not repeated herein. Here, the second fixing assembly 204 may include a second fixing frame in the shape of a ring and a second fixing rack fixedly connected to the second fixing frame. The second mask plate 202 may be fixedly connected to the second fixing frame. The second fixing rack may have a plurality of fourth through holes. The third mask region 202a and the corresponding fourth mask region 202b may be disposed in one fourth through hole, and each fourth through hole may be configured to form one film layer of the display panel 10.

In summary, the present disclosure provides a mask assembly which may include the first mask plate and the second mask plate. In addition, the minimum distance between the target first through hole formed in the second mask region in the first mask plate and the first mask region in the target direction is different from the minimum distance between the target second through hole formed in the fourth mask region in the second mask plate and the third mask region in the target direction. Thus, the second cathode layer of the display panel prepared by using the mask assembly is prevented from completely covering the second display region, such that the influence of the second cathode layer on the light transmittance is reduced, and the imaging effect of the front camera disposed in the second display region is better.

Figure 28:
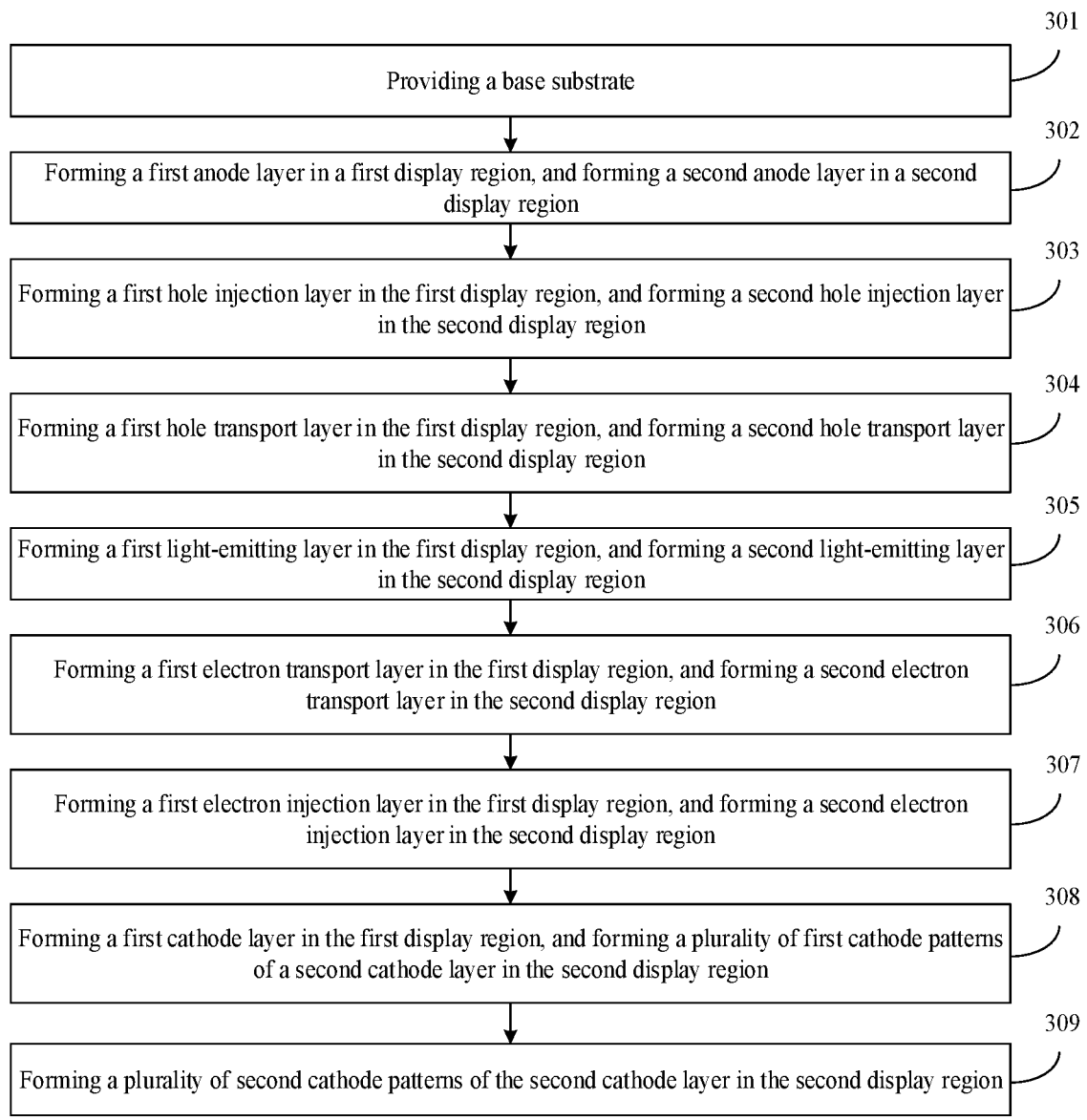
FIG. 28 is a flowchart of a method for manufacturing a display panel according to an embodiment of the present disclosure.

FIG. 28 is a flowchart of a method for manufacturing a display panel according to an embodiment of the present disclosure. Referring to FIG. 28, the method may include the following steps.

In 301, a base substrate is provided.

The base substrate 101 may include a first display region 101a and a second display region 101b disposed on one side of the first display region 101a. The base substrate 101 may be a glass substrate.

In 302, a first anode layer is formed in the first display region, and a second anode layer is formed in the second display region.

In the embodiments of the present disclosure, the first anode layer 102 and the second anode layer 105 may be prepared by the one-time patterning process. In addition, materials for preparing the first anode layer 102 and the second anode layer 105 may be the same. Optionally, the materials for preparing the first anode layer 102 and the second anode layer 105 may include ITO and Ag.

In 303, a first hole injection layer is formed in the first display region, and a second hole injection layer is formed in the second display region.

Optionally, each of the first hole injection layer 110 and the second hole injection layer 114 may include a plurality of hole injection patterns spaced apart, and may be prepared by using a fine metal mask (FMM).

In 304, a first hole transport layer is formed in the first display region, and a second hole transport layer is formed in the second display region.

Optionally, the first hole transport layer 111 and the second hole transport layer 115 may be prepared by using an open mask plate. That is, each of the first hole transport layer 111 and the second hole transport layer 115 is of a plate-shaped structure.

Alternatively, the first hole transport layer 111 and the second hole transport layer 115 may be prepared by using the mask assembly according to the embodiments of the present disclosure. Here, the structure of the prepared first hole transport layer 111 may be the same as that of the first cathode layer 104 in the display panel 10 according to the above embodiments, and the structure of the prepared second hole transport layer 115 may be the same as that of the second cathode layer 107 in the display panel 10 according to the above embodiments.

That is, the first hole transport layer 111 may be of a plate-shaped structure. The second hole transport layer 115 may include a plurality of hole transport patterns. The plurality of hole transport patterns are independent from each other in a first direction or a second direction. Each hole transport pattern includes a hole transport main body portion and a hole transport connection portion connected to the hole transport main body portion. The hole transport connection portion of each hole transport pattern laps over the hole transport connection portion of the adjacent hole transport pattern. In addition, the distance between the hole transport connection portion and the base substrate is longer than or equal to that between the hole transport main body portion and the base substrate.

In 305, a first light-emitting layer is formed in the first display region, and a second light-emitting layer is formed in the second display region.

In the embodiments of the present disclosure, the first light-emitting layer 103 and the second light-emitting layer 106 may be prepared by the one-time patterning process. In addition, materials for preparing the first light-emitting layer 103 and the second light-emitting layer 106 may be the same.

Each of the first light-emitting layer 103 and the second light-emitting layer 106 includes a plurality of light-emitting layer patterns spaced apart. The first light-emitting layer 103 and the second light-emitting layer 106 may be prepared by the FMM.

Figure 29:
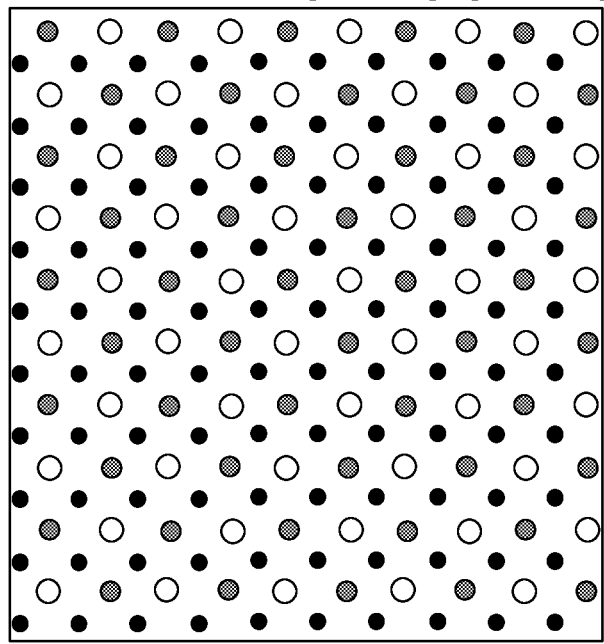
FIG. 29 is a schematic diagram of an arrangement of light-emitting regions of second sub-pixels according to an embodiment of the present disclosure.
Figure 30:
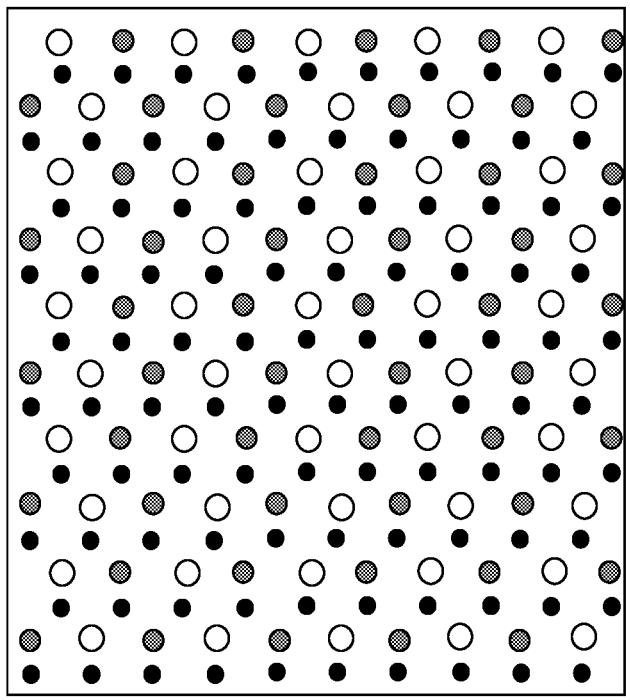
FIG. 30 is a schematic diagram of another arrangement of the light-emitting regions of the second sub-pixels according to an embodiment of the present disclosure.

FIG. 29 and FIG. 30 show light-emitting regions of the second sub-pixels of the display panel. The position of the light-emitting region is determined by the positions of an anode pattern 1051 and a light-emitting layer pattern 1061. Since the arrangements of the second sub-pixels in FIG. 29 and FIG. 30 are different, the arrangements of the light-emitting regions of the second sub-pixels in FIG. 29 and FIG. 30 are different.

In 306, a first electron transport layer is formed in the first display region, and a second electron transport layer is formed in the second display region.

Optionally, the first electron transport layer 112 and the second electron transport layer 116 may be prepared by using an open mask plate. That is, each of the first electron transport layer 112 and the second electron transport layer 116 is of a plate-shaped structure.

Alternatively, the first electron transport layer 112 and the second electron transport layer 116 may be prepared by using the mask assembly according to the embodiments of the present disclosure. Here, the structure of the prepared first electron transport layer 112 may be the same as that of the first cathode layer 104 in the display panel 10 according to the above embodiments, and the structure of the prepared second electron transport layer 116 may be the same as that of the second cathode layer 107 in the display panel 10 according to the above embodiments.

That is, the first electron transport layer 112 may be of a plate-shaped structure. The second electron transport layer 116 may include a plurality of electron transport patterns. The plurality of electron transport patterns are independent from each other in the first direction or the second direction. Each electron transport pattern includes an electron transport main body portion and an electron transport connection portion connected to the electron transport main body portion. The electron transport connection portion of each electron transport pattern laps over the electron transport connection portion of the adjacent electron transport pattern. In addition, the distance between the electron transport connection portion and the base substrate is longer than or equal to that between the electron transport main body portion and the base substrate.

In 307, a first electron injection layer is formed in the first display region, and a second electron injection layer is formed in the second display region.

Optionally, each of the first electron injection layer 113 and the second electron injection layer 117 may include a plurality of electron injection patterns spaced apart. In addition, the first electron injection layer 113 and the second electron injection layer 117 may be prepared by the FMM.

In 308, a first cathode layer is formed in the first display region, and a plurality of first cathode patterns of a second cathode layer are formed in the second display region.

In the embodiments of the present disclosure, the plurality of cathode patterns 1071 in the second cathode layer 107 may be prepared by two times. When the first cathode layer 104 is formed in the first display region 101a, a plurality of first cathode patterns of the second cathode layer 107 may be simultaneously formed in the second display region 101b. That is, the first cathode layer 104 and the plurality of first cathode patterns in the second cathode layer 107 may be prepared by the one-time patterning process.

Figure 31:
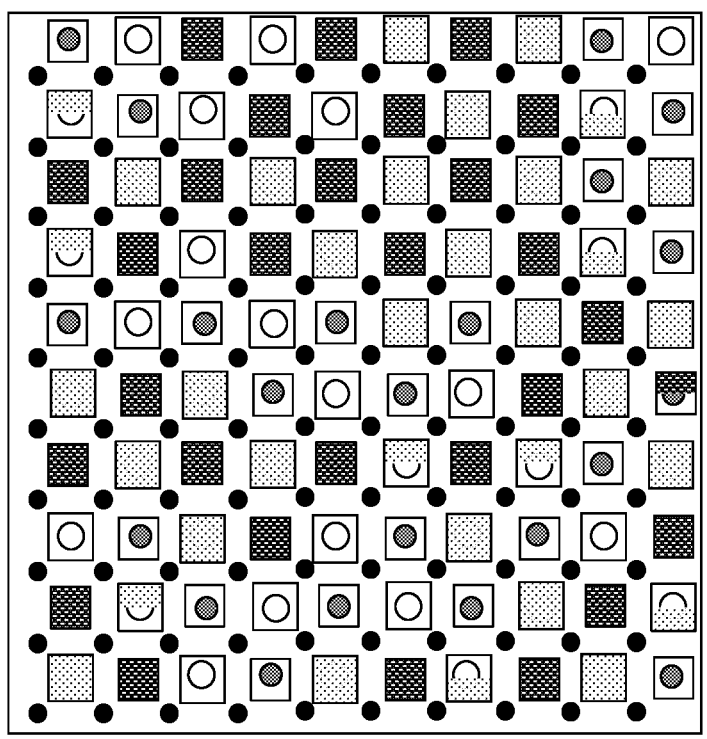
FIG. 31 is a schematic diagram of forming a plurality of cathode patterns of a first type according to an embodiment of the present disclosure.
Figure 32:
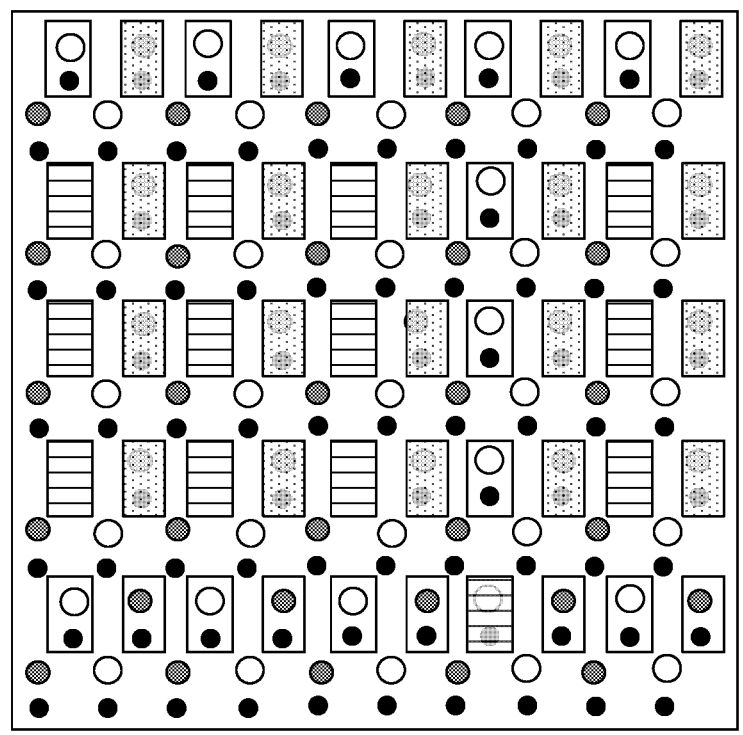
FIG. 32 is another schematic diagram of forming a plurality of cathode patterns of the first type according to an embodiment of the present disclosure.

Referring to FIG. 31, the plurality of first cathode patterns may include a plurality of cathode patterns of the first type and a plurality of cathode patterns of the second type. Each cathode pattern of the first type may cover a light-emitting region of one sub-pixel of the first color, and each cathode pattern of the second type may cover a light-emitting region of one sub-pixel of the second color. Alternatively, referring to FIG. 32, the plurality of first cathode patterns may include a plurality of cathode pattern of the fourth type and a plurality of cathode pattern of the fifth type. Each cathode pattern of the fourth type may cover the light-emitting region of one sub-pixel of the first color and the light-emitting region of one sub-pixel of the third color. Each cathode pattern of the fifth type may cover the light-emitting region of one sub-pixel of the second color and the light-emitting region of one sub-pixel of the third color.

In 309, a plurality of second cathode patterns of the second cathode layer are formed in the second display region.

After the plurality of first cathode patterns is prepared, a plurality of second cathode patterns of the second cathode layer 107 may be formed in the second display region 101b.

Figure 33:
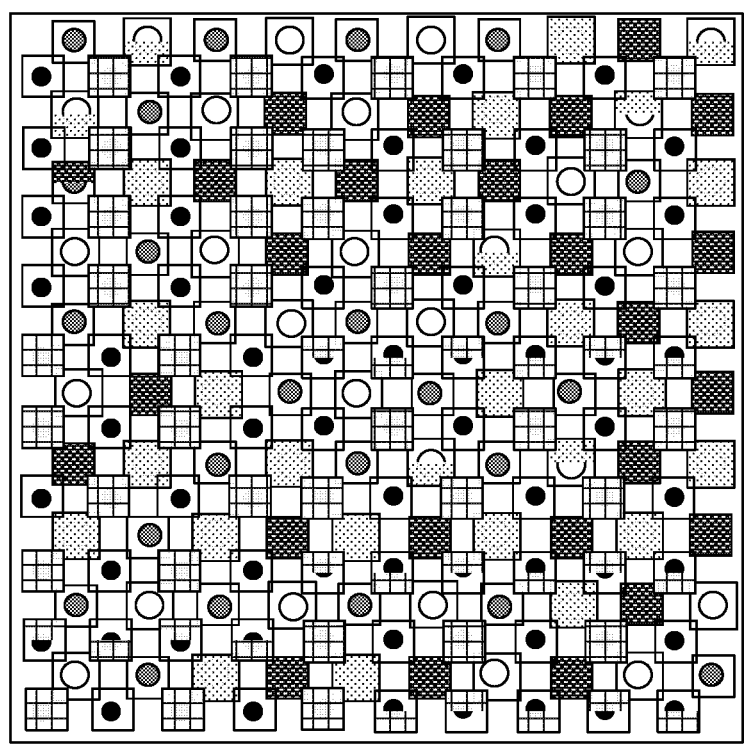
FIG. 33 is a schematic diagram of forming a plurality of cathode patterns of a second type according to an embodiment of the present disclosure.
Figure 34:
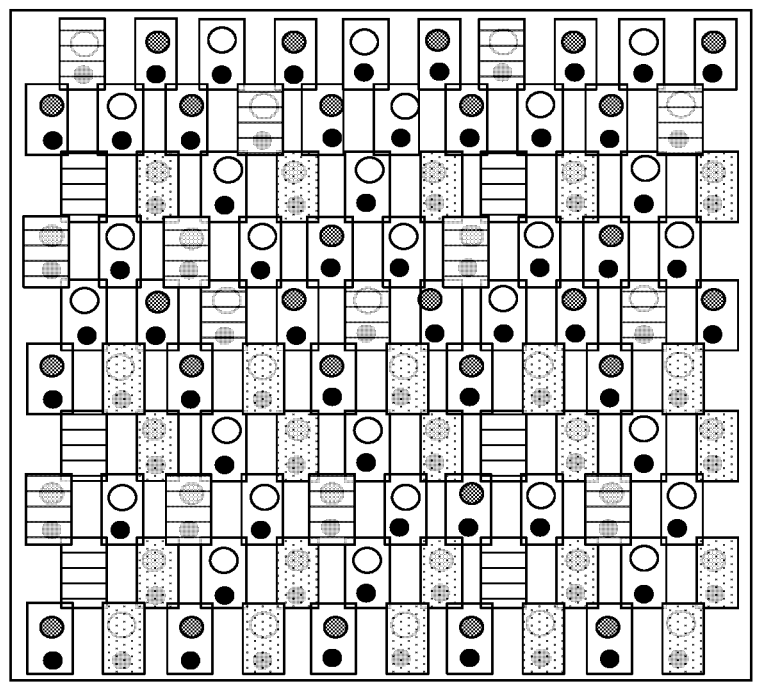
FIG. 34 is another schematic diagram of forming a plurality of cathode patterns of the second type according to an embodiment of the present disclosure.

Referring to FIG. 33, the plurality of second cathode patterns may include a plurality of cathode patterns of the third type. Each cathode pattern of the third type may cover the light-emitting region of one sub-pixel of the third color. Alternatively, referring to FIG. 34, the plurality of second cathode patterns may include a plurality of cathode patterns of the fourth type and a plurality of cathode patterns of the fifth type. Each cathode pattern of the fourth type may cover the light-emitting region of one sub-pixel of the first color and the light-emitting region of one sub-pixel of the third color. Each cathode pattern of the fifth type may cover the light-emitting region of one sub-pixel of the second color and the light-emitting region of one sub-pixel of the third color.

Here, each cathode pattern 1071 in the plurality first cathode patterns and the plurality of second cathode patterns includes a main body portion 10711 and a connection portion 10712 connected to the main body portion 10711. Each connection portion 10712 of the second cathode pattern may lap over the connection portion(s) 10712 of one or more adjacent first cathode patterns. In addition, the distance between the connection portion 10712 of each second cathode pattern and the base substrate 101 is longer than that between the main body portion 10711 and the base substrate 101. The distance between the connection portion 10712 of each first cathode pattern and the base substrate 101 is equal to that between the main body portion 10711 and the base substrate 101.

Since the connection portions 10712 of two adjacent cathode patterns are lapped, the plurality of cathode patterns 1071 included in the second cathode layer 107 can be communicated to each other. Therefore, it is ensured that signals of the second cathode layer 107 in the display panel 10 can be accurately transmitted, and thus the second display region 101b can display images normally.

In the embodiments of the present disclosure, when the first cathode layer 104 and the second cathode layer 107 of the display panel 10 are formed, the first mask plate 201 shown in FIG. 17 or FIG. 20 may be used to form the first cathode layer 104 in the first display region 101a, and to form the plurality of first cathode patterns in the second display region 101b. After that, the second mask plate 202 shown in FIG. 17 or FIG. 20 may be used to form the plurality of second cathode patterns in the second display region 101b.

Here, the first mask region 201a of the first mask plate 201 shown in FIG. 17 or FIG. 20 may be a hollow region which may be used to form the first cathode layer 104, and each first through hole s1 in the second mask region 201b of the first mask plate 201 may be configured to form one first cathode pattern. In addition, the third mask region 202a of the second mask plate 202 shown in FIG. 17 or FIG. 20 is a solid material region, such that no film layer is formed in the first display region 101a, and the first cathode layer 104 is thinner. Each second through hole s2 in the fourth mask region 202b of the second mask plate 202 may be configured to form one second cathode pattern.

In summary, the embodiments of the present disclosure provide a method for manufacturing a display panel. The second cathode layer included in the display panel prepared by the method may be disposed in the second display region of the base substrate. Since the plurality of cathode patterns included in the second cathode layer are independent from each other in the first direction or the second direction, the plurality of cathode patterns does not completely cover the second display region. Thus, the influence of the second cathode layer on light transmission can be reduced, and the imaging effect of the front camera disposed in the second display region 101b is better.

Figure 35:
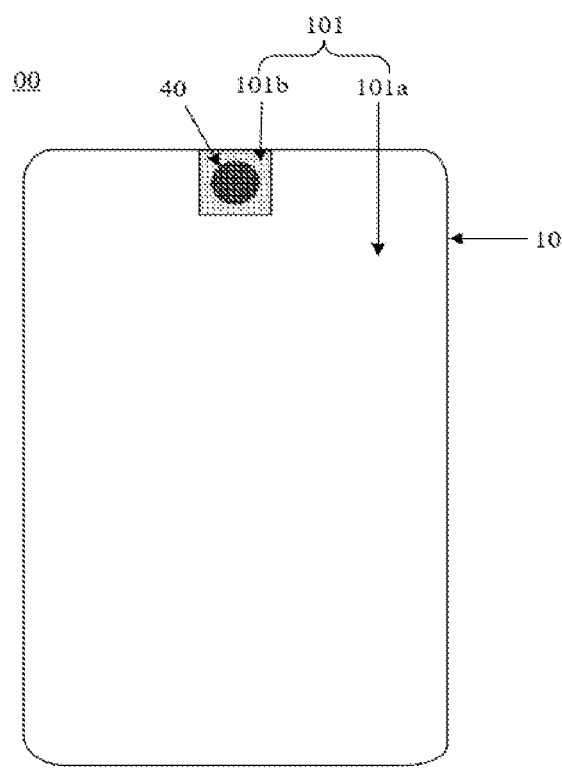
FIG. 35 is a schematic structural diagram of a display device according to an embodiment of the present disclosure.

FIG. 35 is a schematic structural diagram of a display device according to an embodiment of the present disclosure. Referring to FIG. 35, the display device 00 may include an image sensor 40 and the display panel 10 according to the above embodiments. The image sensor 40 may be disposed on the side of the base substrate 101 of the display panel 10 distal from the second anode layer, and disposed in the second display region 101b of the base substrate 101. Here, the image sensor 40 may be a front camera of the display device 00 for shooting images.

Optionally, the display device may be an OLED display device, a liquid crystal display device, a piece of electronic paper, a mobile phone, a tablet computer, a TV, a display, a notebook computer, a digital photo frame, a navigator, or any other product or component having a display function.

The foregoing descriptions are only optional embodiments of the present disclosure, and do not intend to limit the present disclosure. Any variation, equivalent substitution, modification and the like that fall within the spirit and principle of the present disclosure shall be included in the protection scope of the present disclosure.

What is claimed is:

1. A display panel, comprising: a base substrate, comprising a first display region and a second display region disposed on a side of the first display region;
a first anode layer, a first light-emitting layer and a first cathode layer which are disposed in the first display region and are sequentially laminated in a direction distal from the base substrate; and
a second anode layer, a second light-emitting layer and a second cathode layer which are disposed in the second display region and are sequentially laminated in a direction distal from the base substrate,
wherein the second cathode layer comprises a plurality of cathode patterns which are independent from each other in a first direction or a second direction, and each of the cathode patterns comprises a main body portion and a connection portion connected to the main body portion, the connection portion of each cathode pattern laps over the connection portion of an adjacent cathode pattern, and a distance between the connection portion and the base substrate is longer than or equal to a distance between the main body portion and the base substrate;
wherein the second anode layer, the second light-emitting layer and the second cathode layer are capable of being divided into at least one second sub-pixel of a first color, at least one second sub-pixel of a second color and at least one second sub-pixel of a third color; and
an orthographic projection of each of the cathode patterns on the base substrate covers an orthographic projection of a light-emitting region of at least one second sub-pixel of the first color on the base substrate and an orthographic projection of a light-emitting region of at least one second sub-pixel of the third color on the base substrate, or covers an orthographic projection of a light-emitting region of at least one second sub-pixel of the second color on the base substrate and an orthographic projection of a light-emitting region of at least one second sub-pixel of the third color on the base substrate;
wherein among the plurality of cathode patterns, an area of a cathode pattern of a fourth type is less than an area of a cathode pattern of a fifth type,
wherein an orthographic projection of the cathode pattern of the fourth type on the base substrate covers the orthographic projection of the light-emitting region of the second sub-pixel of the first color on the base substrate and the orthographic projection of the light-emitting region of the second sub-pixel of the third color on the base substrate, and an orthographic projection of the cathode pattern of the fifth type on the base substrate covers the orthographic projection of the light-emitting region of the second sub-pixel of the second color on the base substrate and the orthographic projection of the light-emitting region of the second sub-pixel of the third color on the base substrate.

2. The display panel according to claim 1, wherein the first anode layer, the first light-emitting layer and the first cathode layer are capable of being divided into a plurality of first sub-pixels, and an orthographic projection of each of the cathode patterns on the base substrate covers an orthographic projection of a light-emitting region of at least one of the second sub-pixels on the base substrate.

3. The display panel according to claim 2, wherein
an orthographic projection of each of the main body portions on the base substrate covers an orthographic projection of a light-emitting region of at least one of the second sub-pixels on the base substrate; and
an orthographic projection of each connection portion on the base substrate does not overlap an orthographic projection of a light-emitting region of any one of the second sub-pixels on the base substrate.

4. The display panel according to claim 1, wherein the second light-emitting layer comprises a plurality of light-emitting layer patterns spaced apart, and an orthographic projection of the light-emitting layer pattern on the base substrate partially overlaps an orthographic projection of the connection portion on the base substrate.

5. The display panel according to claim 1, wherein the second light-emitting layer comprises a plurality of light-emitting layer patterns spaced apart, and an orthographic projection of the light-emitting layer pattern on the base substrate does not overlap an orthographic projection of the connection portion on the base substrate.

6. The display panel according to claim 1, wherein the distance between the main body portion and the base substrate is longer than or equal to a distance between the first cathode layer and the base substrate.

7. The display panel according to claim 1, wherein in every two lapped connection portions, a distance between a first connection portion and the base substrate is equal to the distance between the first cathode layer and the base substrate, and a distance between a second connection portion and the base substrate is longer than the distance between the first cathode layer and the base substrate.

8. The display panel according to claim 1, wherein the main body portions of the plurality of cathode patterns form a plurality of hollowed-out portions in a surrounding fashion, and transmittance of each of the hollowed-out portions is greater than transmittance of the main body portion.

9. The display panel according to claim 8, wherein every two adjacent hollowed-out portions in the plurality of hollowed-out portions are spaced apart, and the plurality of hollowed-out portions comprises a plurality of first hollowed-out portions and a plurality of second hollowed-out portions, and a ratio of an area of the first hollowed-out portion to an area of the second hollowed-out portion ranges from 0.8 to 1.2.

10. The display panel according to claim 8, wherein a distance between the hollowed-out portion and the base substrate is shorter than the distance between the connection portion and the base substrate.

11. The display panel according to claim 1, wherein the base substrate further comprises: a wiring region disposed on the same side of the first display region and the second display region; and the display panel further comprises: a cathode signal line disposed in the wiring region; and
wherein the cathode signal line is electrically connected to the first cathode layer and the second cathode layer, and is configured to provide a cathode signal for the first cathode layer and the second cathode layer.

12. The display panel according to claim 1, wherein each of the cathode patterns is polygonal, circular or elliptical.

13. The display panel according to claim 1, wherein the main body portions of the plurality of cathode patterns form a plurality of hollowed-out portions in a surrounding fashion, and each of the hollowed-out portions is polygonal, circular or elliptical.

14. The display panel according to claim 1, wherein each connection portion is polygonal, circular or elliptical.

15. The display panel according to claim 1, wherein the main body portions of the plurality of cathode patterns form a plurality of hollowed-out portions in a surrounding fashion, and the cathode patterns, the hollowed-out portions and the connection portions are all rectangular; and the display panel further comprises: a plurality of anode signal lines, and an extension direction of the anode signal line is parallel to an extension direction of one edge of the cathode pattern,
wherein an orthographic projection of at least one of the anode signal lines on the base substrate overlaps the orthographic projection of the connection portion on the base substrate, an orthographic projection of at least one of the anode signal lines on the base substrate overlaps an orthographic projection of the hollowed-out portion on the base substrate, and distances between two adjacent anode signal lines and a center of the hollowed-out portion are different.

16. The display panel according to claim 1, wherein each connection portion is rectangular, and a length of each of two perpendicular edges of the connection portion ranges from 0.002 mm to 0.1 mm.

17. The display panel according to claim 1, wherein each of the cathode patterns is rectangular, and a length of each of two perpendicular edges of the cathode pattern ranges from 0.01 mm to 0.3 mm.

18. The display panel according to claim 17, wherein a distance between two adjacent cathode patterns ranges from 0.01 mm to 0.2 mm.

19. The display panel according to claim 1, wherein a shape of the second display region is a rectangle, wherein a length of one of two perpendicular edges of the rectangle ranges from 2 mm to 10 mm, and a length of the other one of the two perpendicular edges of the rectangle ranges from 2 mm to 15 mm.

20. A method for manufacturing a display panel, comprising:
providing a base substrate, wherein the base substrate comprises a first display region and a second display region disposed on a side of the first display region;
forming a first anode layer in the first display region, and forming a second anode layer in the second display region;
forming a first light-emitting layer in the first display region, and forming a second light-emitting layer in the second display region;
forming a first cathode layer in the first display region, and forming a plurality of first cathode patterns of a second cathode layer in the second display region; and
forming a plurality of second cathode patterns of the second cathode layer in the second display region,
wherein each cathode pattern in the plurality of first cathode patterns and the plurality of second cathode patterns comprises: a main body portion and a connection portion connected to the main body portion, the connection portion of each of the second cathode patterns laps over the connection portion(s) of one or more adjacent first cathode patterns, a distance between the connection portion of each of the second cathode patterns and the base substrate is longer than a distance between the main body portion and the base substrate, and a distance between the connection portion of each of the first cathode patterns and the base substrate is equal to a distance between the main body portion and the base substrate;
wherein forming the first cathode layer and the second cathode layer comprises:
forming the first cathode layer in the first display region and forming the plurality of first cathode patterns in the second display region, by using a first mask plate; and
forming the plurality of second cathode patterns in the second display region by using a second mask plate,
wherein the first mask plate comprises: a first mask region and a second mask region, the first mask region is a hollow region configured to form the first cathode layer, the second mask region comprises a plurality of first through holes, and each of the first through holes is configured to form one of the first cathode patterns; and
the second mask plate comprises: a third mask region and a fourth mask region, the third mask region is a solid material region, and the fourth mask region comprises a plurality of second through holes, and each of the second through holes is configured to form one of the second cathode patterns.

\* \* \* \* \*